United States Patent [19]
Hazelton

[11] Patent Number: 6,097,114
[45] Date of Patent: Aug. 1, 2000

[54] COMPACT PLANAR MOTOR HAVING MULTIPLE DEGREES OF FREEDOM

[75] Inventor: Andrew J. Hazelton, San Carlos, Calif.

[73] Assignee: Nikon Corporation, Belmont, Calif.

[21] Appl. No.: 09/135,624

[22] Filed: Aug. 17, 1998

[51] Int. Cl.$^7$ .......................... H02K 41/00; H01L 21/00
[52] U.S. Cl. .................. 310/12; 355/53; 355/72
[58] Field of Search .................. 310/12; 318/135, 318/574, 625; 74/471; 108/137, 138; 29/721, 760, 785; 355/53, 72

[56] References Cited

U.S. PATENT DOCUMENTS

| | | | |
|---|---|---|---|
| Re. 27,436 | 7/1972 | Sawyer | 346/29 |
| 3,656,014 | 4/1972 | Rich | 310/13 |
| 3,851,196 | 11/1974 | Hinds | 310/12 |
| 3,857,078 | 12/1974 | Sawyer | 318/608 |
| 3,878,411 | 4/1975 | Nocito et al. | 310/12 |
| 3,935,909 | 2/1976 | Mabuchi et al. | 173/163 |
| 3,940,676 | 2/1976 | Dudley | 318/612 |
| 3,942,054 | 3/1976 | Kristen et al. | 310/179 |
| 3,958,138 | 5/1976 | Eastham et al. | 310/13 |
| 4,130,769 | 12/1978 | Karube | 310/46 |
| 4,143,289 | 3/1979 | Williams | 310/156 |
| 4,317,072 | 2/1982 | Goof et al. | 318/138 |
| 4,336,475 | 6/1982 | Morinaga et al. | 310/198 |
| 4,369,383 | 1/1983 | Langley | 310/12 |
| 4,385,248 | 5/1983 | Laskaris | 310/52 |
| 4,393,344 | 7/1983 | Whellams | 318/759 |
| 4,445,061 | 4/1984 | Jackson | 310/156 |
| 4,463,276 | 7/1984 | Nakamura | 310/266 |

(List continued on next page.)

FOREIGN PATENT DOCUMENTS

WO 98/49763   11/1998   WIPO .

OTHER PUBLICATIONS

Holmes et al., "A Long–Rang Scanning Stage Design (The LORS Project)" 1996 Proceedings vol. 14, *American Society For Precision Engineering*, pp. 322–327, (month unknown).

Ofori–Tenkorang et al., "A Comparataive Analysis of Torque Production in Halbach and Conventional Surrface–Mounted Permanent–Magent Synchronous Motors", *1995 IEEE*, pp. 657–663, (month unknown).

Williams et al., "Magnetic Bearing Stage for Photolithography", *Annals of the CIRP*, vol. 42/1993, pp. 607–610, (month unknown).

Tomita et al., "Study on a Surface–Motor Driven Precise Positioning System", *Journal of Dynamic Systems, Measurement, and Control*, Sep. 1995, vol. 117, pp. 311–319.

Trumper et al., "Control and Actuator Design For A Precision Magnetic Suspension Linear Bearing", *SPIE vol. 1696 Controls for Optical Systems (1992)*, pp. 2–15, (month unknown).

Trumper et al., "Magnet Arrays For Synchronous Machines", *1993 IEEE*, pp. 9–18. (Month Unknown).

Trumper et al., "Design and Analysis Framework For Linear Permanent Magnet Machines", *1994 IEEE*, pp. 216–223, (month unknown).

*Primary Examiner*—Nestor Ramirez
*Assistant Examiner*—Judson H. Jones
*Attorney, Agent, or Firm*—Skjerven, Morrill, MacPherson, Franklin and Friel

[57] ABSTRACT

A planar motor provides essentially unlimited range of motion in six degrees of freedom to an associated stage, e.g. for photolithography, in either a moving magnet or a moving coil configuration. Moving magnet configurations eliminate cumbersome cables and hoses, and allow higher speed. The motor incorporates checkerboard magnet arrays and/or planar coil arrangements involving overlapped polygonal coil units. Alternatively, the stage is suspended by permanent magnets or by electromagnetic force generated by the motor, allowing the altitude and the tilt angle of the stage to be controlled by commutation of a motor coil. Selective commutation and energizing of coil units conserve power and reduce heat, thermal expansion, and warpage, which otherwise degrade precision. This planar motor provides a single stage to replace conventional stacked stages, thereby increasing effective stiffness and reducing vibration due to low frequency resonances. Electromagnetic levitation of the stage enhances performance and versatility.

106 Claims, 16 Drawing Sheets

U.S. PATENT DOCUMENTS

| | | | |
|---|---|---|---|
| 4,485,339 | 11/1984 | Trost | 318/640 |
| 4,535,278 | 8/1985 | Asakawa | 318/687 |
| 4,547,713 | 10/1985 | Langley et al. | 318/254 |
| 4,551,645 | 11/1985 | Takahahi et al. | 310/46 |
| 4,555,650 | 11/1985 | Asakawa | 318/135 |
| 4,563,808 | 1/1986 | Lender | 29/596 |
| 4,626,749 | 12/1986 | Asakawa | 318/135 |
| 4,645,961 | 2/1987 | Malsky | 310/156 |
| 4,654,571 | 3/1987 | Hinds | 318/687 |
| 4,667,123 | 5/1987 | Denk et al. | 310/156 |
| 4,692,631 | 9/1987 | Dahl | 290/55 |
| 4,714,851 | 12/1987 | Bertram | 310/156 |
| 4,733,118 | 3/1988 | Mihalko | 310/177 |
| 4,734,603 | 3/1988 | von der Heide et al. | 310/72 |
| 4,742,286 | 5/1988 | Phillips | 318/640 |
| 4,758,750 | 7/1988 | Itagaki et al. | 310/13 |
| 4,767,954 | 8/1988 | Phillips | 310/12 |
| 4,794,284 | 12/1988 | Buon | 310/12 |
| 4,912,746 | 3/1990 | Oishi | 310/12 |
| 4,937,485 | 6/1990 | Mihalko | 310/208 |
| 5,083,905 | 1/1992 | Mohn | 417/45 |
| 5,126,648 | 6/1992 | Jacobs | 318/640 |
| 5,179,305 | 1/1993 | Van Engelen | 310/13 |
| 5,189,268 | 2/1993 | Pavoz et al. | 187/112 |
| 5,196,745 | 3/1993 | Trumper | 310/12 |
| 5,319,336 | 6/1994 | Alcon | 335/296 |
| 5,327,060 | 7/1994 | Van Engelen | 318/640 |
| 5,334,892 | 8/1994 | Chitayat | 310/12 |
| 5,352,946 | 10/1994 | Hoffman et al. | 310/12 |
| 5,357,158 | 10/1994 | Takei | 310/12 |
| 5,399,930 | 3/1995 | Culp | 310/328 |
| 5,416,396 | 5/1995 | Takei | 318/653 |
| 5,519,266 | 5/1996 | Chitayat | 310/12 |
| 5,528,188 | 6/1996 | Lee | 318/568.17 |
| 5,723,929 | 3/1998 | Niimi | 310/154 |
| 5,925,956 | 7/1999 | Ohzeki | 310/90.5 |

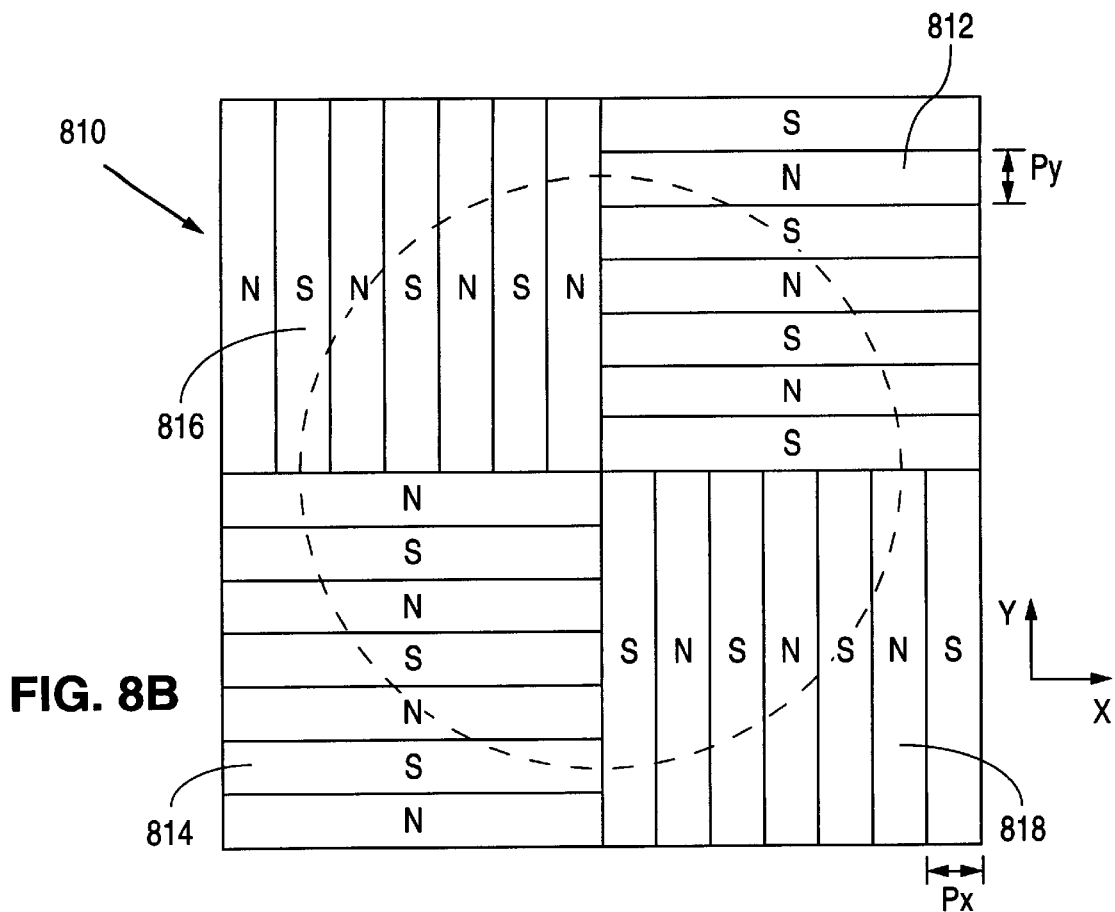
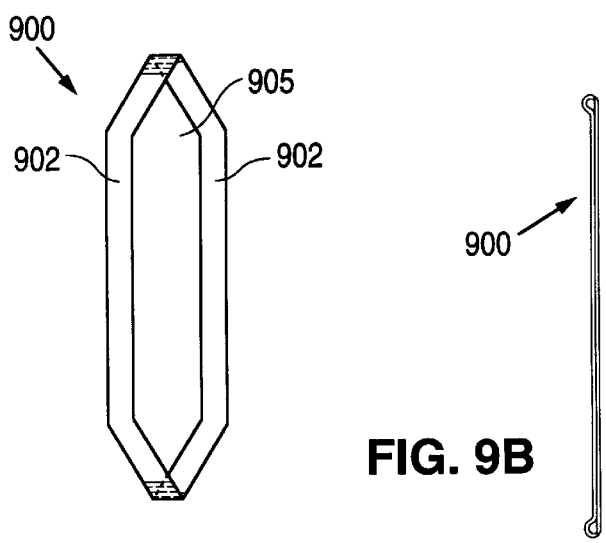
FIG. 8B
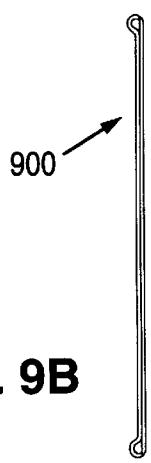
FIG. 9B
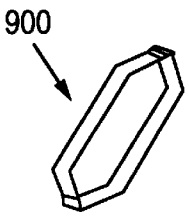
FIG. 9C
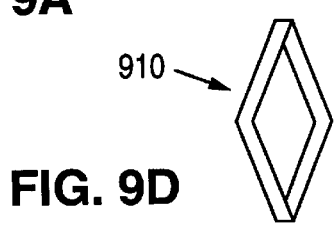
FIG. 9A
FIG. 9D
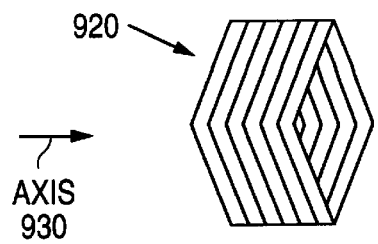
FIG. 9E

COMPACT PLANAR MOTOR HAVING MULTIPLE DEGREES OF FREEDOM

FIELD OF THE INVENTION

This invention relates to planar motors, more specifically to high precision, high speed planar motors for photolithographic systems.

BACKGROUND

Many precision systems, such as those used in semiconductor processing, inspection and testing, use linear motors for positioning objects such as semiconductor wafers. Such a system (e.g. a lithographic instrument) may have an X stage stacked on a Y stage. Conventional systems are complex, heavy and inefficient to operate. In order to improve precision and efficiency of object positioning, planar motors are designed for simplicity, light weight, and better efficiency.

In accordance with the Lorentz law, linear or planar motor uses electromagnetic force (frequently called Lorentz force) to propel a moving part. As those skilled in the art will recognize, a wire carrying an electric current in a magnetic field creates Lorentz force, the formula of which is:

$$F = N\, L\, B \times I,$$

where F represents Lorentz force, N the number of wires, B the magnetic flux, and I the electric current. For a coil with a given length L and magnetic flux B, to maximize force F, one has to maximize the number of wires N and current I. The above formula determines both the magnitude and the direction of force F, since force F, magnetic flux B, and current I are all represented as vectors, and the symbol "x" represents vector cross product multiplication. Accordingly, force F is directed perpendicular (orthogonal) to the plane defined by magnetic flux B and current I, and is maximized when magnetic flux B and current I are directed orthogonally relative to each other.

Disclosures in the field of planar motors include Hinds U.S. Pat. No. 3,851,196, Hinds U.S. Pat. No. 4,654,571, Trumper U.S. Pat. No. 5,196,745, and Chitayat U.S. Pat. No. 5,334,892. These patents describe planar motors that have significant limitations. For example, the planar motor of Hinds '196 has limited range of motion because each portion of the stationary magnet array can only generate force in a single direction. Thus, each coil array must always be located above the corresponding magnet array. This limits the range of movement for a given size actuator. In addition, the coils and magnets are iron-core and generate sizable attractive forces as well as force ripple. This does not allow for motion in six degrees of freedom because the levitation force cannot overcome the attractive force between the two pieces.

Hinds '571 suffers from a non-compact design. A large portion of the base of the moving portion of the stage is covered by the air bearing pads and other elements. Only a small portion of the stage is covered with coils. In addition, the coil design is not the most efficient for producing force, since at most only fifty per cent of the coil can generate force. In addition, the moving coil design has a large number of hoses and cables going to the stage, creating a large bias force. Finally, this design does not generate force for a six-degree-of-freedom movement.

Trumper discloses several stage designs with six degrees of freedom. The invention uses conventional coils. Each coil array must be located above a corresponding linear magnet array. This restricts the range of movement for a given sized stage.

Chitayat discloses several planar motor designs, which permit a wide range of motion, but only restricted to translation and rotation in a plane. Thus, the motor of Chitayat is incapable of moving with six degrees of freedom.

What is needed in the art is a planar motor that provides a wide range of motion in six degrees of freedom with high speed and precision, having a compact configuration and energy-efficient operation without cumbersome hoses and cables attached to the moving stage.

SUMMARY

The present invention is directed to a planar motor capable of moving with e.g. six degrees of freedom. In some embodiments, the planar motor includes a planar magnet array cooperating with a substantially parallel coil array. The planar magnet array includes a plurality of magnetic poles which generate a magnet field of periodic alternating polarity. The coil array, typically including a plurality of individual coil units, is electrically connected to a commutation circuit, which selectively energizes the coil array by supplying electric current to generate an electromagnetic force, which in turn typically drives the motion of a positioning stage relative to a fixed platform. The commutation circuit is configured to control and energize each individual coil unit independently. Each individual coil unit in cooperation with the magnet array, can generate electromagnetic force components in any desired direction, both parallel and orthogonal to the plane of the coil array. In some embodiments, different coil units are sequentially energized. In some embodiments, different coil units are at least in part simultaneously energized.

The coil array is typically partitioned into at least two independent coil sets, which respectively generate electromagnetic force in independent directions. In some embodiments, these directions are non-collinear and are parallel to the plane of the coil array, thus providing two-dimensional translation and rotation in an XY plane substantially parallel to the plane of the coil array. In some embodiments, these directions are at least partially orthogonal to the plane of the coil array, providing magnetic levitation of the positioning stage and controlling the altitude and inclination of the positioning stage relative to a fixed platform. Some embodiments include bearings, for example air bearings, or permanent suspension magnets in whole or in part to support the positioning stage against gravity.

The planar motor in some embodiments has a moving magnet array configuration, and in other embodiments has a moving coil array configuration. In both moving coil array and moving magnet array configurations, some embodiments incorporate a checkerboard magnet array and a substantially planar coil array containing rows of shingle like overlapped polygonal shaped coil units. In some embodiments, the magnets have an octagonal cross-sectional shape, although a variety of shapes is possible. In some embodiments, the magnet array includes transverse magnets that strengthen magnetic flux. Some checkerboard magnet arrays include quarter magnets and half magnets around the checkerboard perimeter. Quarter magnets, having a cross-sectional area roughly one-quarter that of full sized magnets in the interior of the checkerboard array, are placed at the four corners of the checkerboard pattern. Half magnets, having a cross-sectional area roughly one-half that of a full-sized magnet, are spaced alternately along the four sides of the checkerboard connecting the four corners. These quarter magnets and half magnets provide efficient magnetic flux coupling with the full sized magnets.

In some embodiments, a coil unit is configured in a closed band having inner edges surrounding a void, for example a polygonal shape such as a diamond shape, hexagonal shape, or parallelogram shape. Preferably a coil unit has a length that is an odd integer multiple of the magnetic pitch of the associated magnet array. In some embodiments, the rows of coil units are further arranged laterally in a side-by-side or overlapped fashion. In some embodiments, the independent coil sets are typically stacked one on top of one another. Alternatively, two or more independent coil sets are arranged in a single plane, for example in an alternating checkerboard pattern.

Some embodiments enable an essentially unlimited range of motion in as many as six degrees of freedom. Selective commutation of individual coil units in a moving magnet array allows energizing to be confined only to those coil units instantaneously underlying the moving stage, thus reducing power consumption and heat generation, which could otherwise degrade precision through thermal expansion and warpage. Replacing conventional stacked stages with a single monolithic stage results in compactness, increases effective stiffness, and reduces vibration due to low frequency mechanical resonances, thereby increasing precision and reducing wear. Moving permanent magnet motors eliminate bias forces associated with conventional attached cables and hoses, and allow higher speed and precision. The capability to levitate the stage by magnetic suspension enhances performance and versatility. The advantages of a planar motor in accordance with the present invention are particularly applicable for photolithography.

Thus, in accordance with the invention, a planar motor provides a wide range of motion in six degrees of freedom with high speed and precision, having a compact configuration and energy-efficient operation without cumbersome hoses and cables attached to the moving stage.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where an element is the same in different drawings.

FIG. 8B is a plan view of a two-by-two type of moving magnet array;

FIGS. 9A, 9B, and 9C are respectively a plan view, an edge view, and an isometric view of a hexagonally shaped coil unit for a planar motor, in accordance with the invention;

FIGS. 9D–9G are plan views showing the structure and application of various coil units, in accordance with the invention;

DETAILED DESCRIPTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings are not to be considered in a limiting sense as it is understood that the present invention is in no way limited to the embodiments illustrated.

A planar motor according to the present invention includes a magnet array in cooperation with a coil array. In some embodiments the motor has a moving magnet configuration, and in some embodiments the motor has a moving coil configuration. The moving coil configuration is described first below.

Figure 1A:
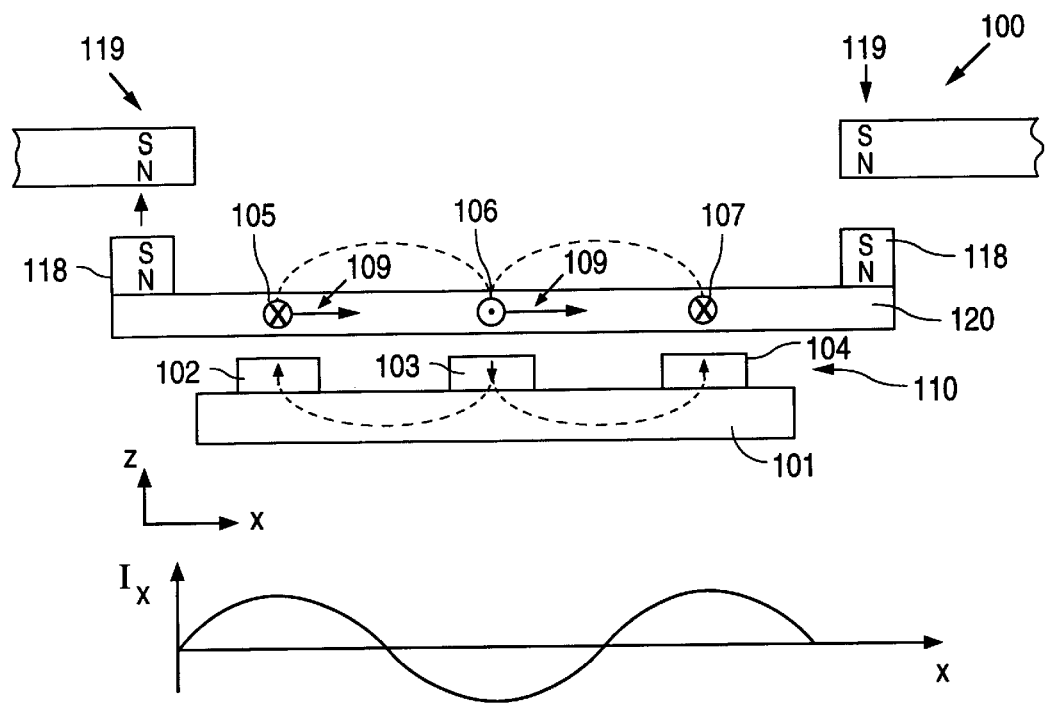
FIG. 1A is a cross-sectional elevation view showing the base of a planar motor including magnets and magnetic circuit material relative to coordinate arrows, aligned with a graphical representation of the electromagnetic force component Ix.
Figure 1B:
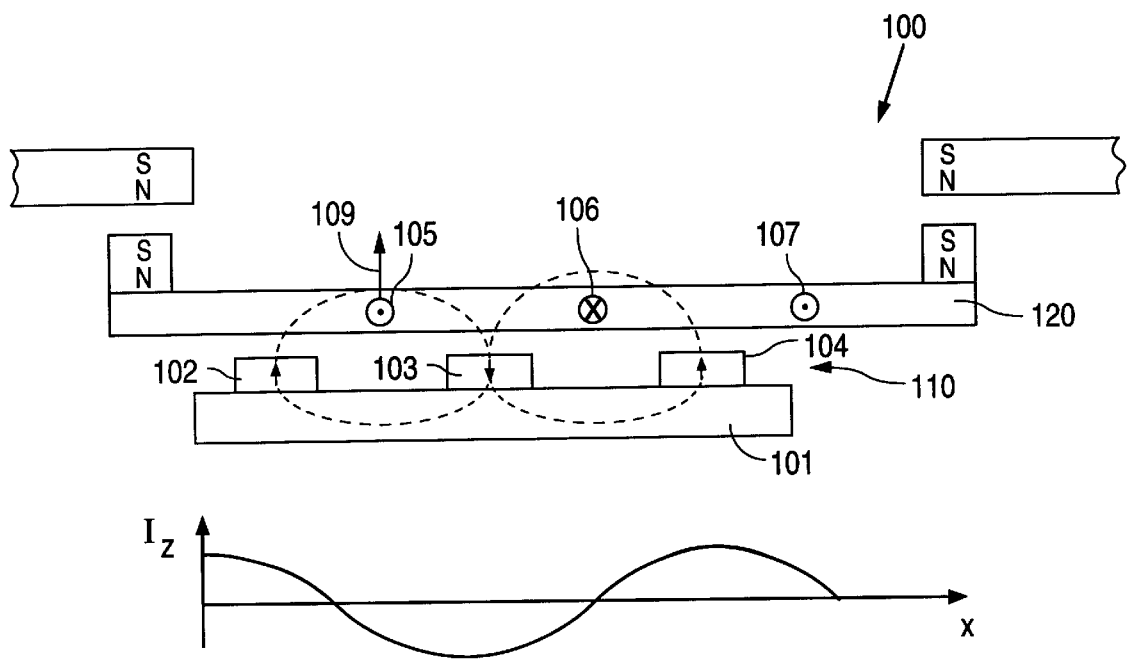
FIG. 1B is a cross-sectional elevation view showing a configuration of a planar motor in which wires are between magnets, aligned with a graphical representation of the electromagnetic force component Iz.

The principles of a planar motor according to the present invention may be more clearly understood by referring to FIGS. 1A and 1B. FIG. 1A is a cross-sectional elevation view relative to coordinate arrows X, Z showing a planar motor 100, including a magnet array 110 containing magnets 102, 103, and 104 mounted on magnetic circuit material 101. Planar motor 100 also includes a moving coil array 120, illustrated for simplicity as consisting of three wires 105, 106, and 107 all connected to a single phase source of electric current. A three phase motor, for example, includes two additional phases of wires (not shown).

Figure 1C:
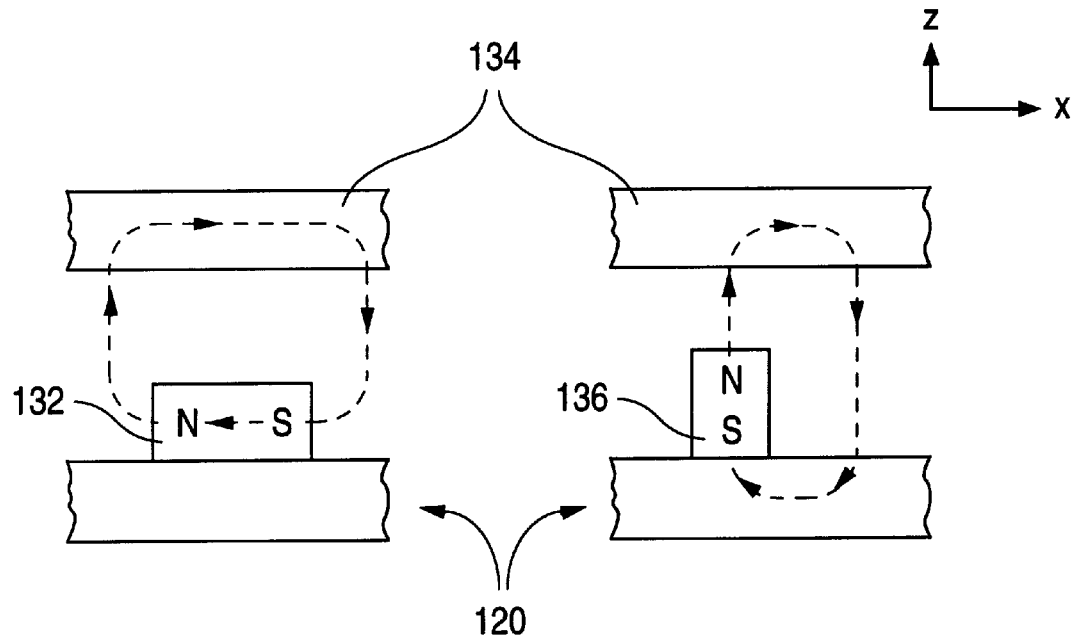
FIG. 1C is a detail view of a lifting magnet configuration, in accordance with some embodiments.

Optional hoist magnets 119 and corresponding lifting magnets 118 are used to help suspend coil array 120 against gravity above magnet array 110. In other embodiments as shown in FIG. 1C, a pair of hoist and lifting magnets 119, 118 is replaced by an individual lifting magnet or hoist magnet, for example lifting magnet 136, oriented vertically or hoist magnet 132, oriented horizontally, and an opposed plate 134 of iron or other magnetic material. Lifting magnet 136, 132 and plate 134 form a magnetic circuit for magnetic flux lines (shown by dashed lines in FIG. 1C), thereby creating an attractive magnetic force between lifting magnet 136, 132 and plate 134.

As shown in FIG. 1A, wires 105, 106, and 107 are located directly above the magnets 102, 103 and 104, respectively. A commutation circuit (not shown) controls and supplies electric current to wires 105, 106, and 107. In FIGS. 1A and 1B a solid dot on a wire indicates that electric current flows in the +Y direction out of the plane of the figure, whereas a cross on a wire indicates that electric current flows in the −Y direction into the plane of the figure. Thus, electric current on wires 105 and 107 flows into the plane of the figure, while the electric current on wire 106 flows out of the plane of the figure. The magnetic flux path of magnet array 110 is indicated by the dashed lines on FIGS. 1A and 1B, while the magnetic polarity is indicated by arrows on magnets 102, 103, 104. In the configuration shown in FIG. 1A, those skilled in the art will recognize that according to the Lorentz law, the electromagnetic force acts on coil array 120 exclusively in the X direction. For convenience this electric current configuration is designated "X current," or Ix. It should be noted that, in accordance with the laws of physics, each electromagnetic force component acting on the coil is balanced by an equal but oppositely directed electromagnetic force acting on the magnet array. As wires 105, 106, 107 of coil array 120 move laterally relative to magnets 102, 103, 104 respectively of magnet array 110, the electric current Ix eventually drops to zero. Electric current Ix typically is supplied by the commutation circuit as a sinusoidal waveform, as shown graphically in alignment with planar motor 100 in FIG. 1A. Although square wave commutation is sufficient in some planar motor embodiments, in other embodiments it is preferable to use a less abrupt and more gradual commutation waveform, such as sinusoidal, for precise motion and positioning of a stage. Positioning stages driven by linear motors are described in Lee, U.S. Pat. No. 5,528,118, issued Jun. 18, 1996, the specification of which is incorporated herein by reference in its entirety.

FIG. 1B is a cross-sectional elevation view showing the configuration of planar motor 100 at a later time in which wires 105 and 106 are positioned midway between respective magnets 102, 103, 104. The commutation circuit (not shown) provides electric current flowing out of the plane of the figure on wire 105. Similarly, electric current in the direction into the plane of the figure is provided on wire 106.

In accordance with the Lorentz law, the resultant electromagnetic force acts on coil 120 exclusively in the Z direction. For convenience the electric current configuration generating this force is designated "Z current, " or Iz. The Z direction force acts to urge coil array 120 upward above magnet array 110. The magnitude of the electric current adjusts the altitude of coil array 120 above magnet array 110. The angular inclination of coil array 120 relative to magnet array 110 can be adjusted by supplying currents of differing magnitudes through different wires. For example, a stronger current Iz provided to wire 106 than to wire 105 causes the right hand side of coil array 120 to incline higher relative to the left hand side of coil array 120 above magnet array 110. A sinusoidally shaped waveform, as shown graphically in alignment with planar motor 100 in FIG. 1B, causes electric current Iz to fall eventually to zero, when wires 105 and 106 move farther relative to respective magnets 102, 103, 104.

Ideally, the electric current through a wire is predetermined by the instantaneous location of the wire relative to the magnets. For example, a wire directly above a magnet should be provided with maximum X current to maximize the X direction force, and a wire equidistant between two magnets should be provided with maximum Z current to maximize the Z direction force. The directions of the currents are reversed for wires located at positions having reversed magnetic flux.

For purposes of clarity, only three coil wires 105, 106 and 107 are shown in FIGS. 1A and 1B. As is well known to those skilled in the art, typical planar motor coil implementations include numerous closely packed wires connected with a commutation circuit in multiple phases, generally two or three phases, with each phase having a plurality of wires, generally with equal numbers of wires for each such phase. Typically all of the wires belonging to a particular phase are commutated together. In an embodiment having coils of more than one phase, when the electric current Ix is decreasing for one phase, a similar electric current Ix is typically increasing for another phase. The sinusoidal currents are adjusted to provide a constant force. This prevents the stage from traveling with uneven speeds. Similarly, in an embodiment when electric current Iz is decreasing for one phase, a similar current Iz is typically increasing for another phase, thus preventing the coil from oscillating up and down in elevation with changes in current Iz.

The Lorentz force on wire 105 in the direction indicated by arrow 109 (see FIGS. 1A and 1B) urges coil array 120 to move in that direction. At a location midway between two magnets 102, 103 the magnetic flux direction is non-vertical, as shown in FIG. 1B. Accordingly the Lorentz force (arrow 109) on wire 105 has a Z component, which urges coil array 120 upward and away from magnet array 110, and a horizontal X force component, which urges coil array 120 in the X direction. When only X force is desired, the Z force component is typically offset by an opposing Z force component on a wire commutated by a different phase and having either a magnetic flux or current reversed relative to wire 105, thus leaving a net X direction force.

Figure 1D:
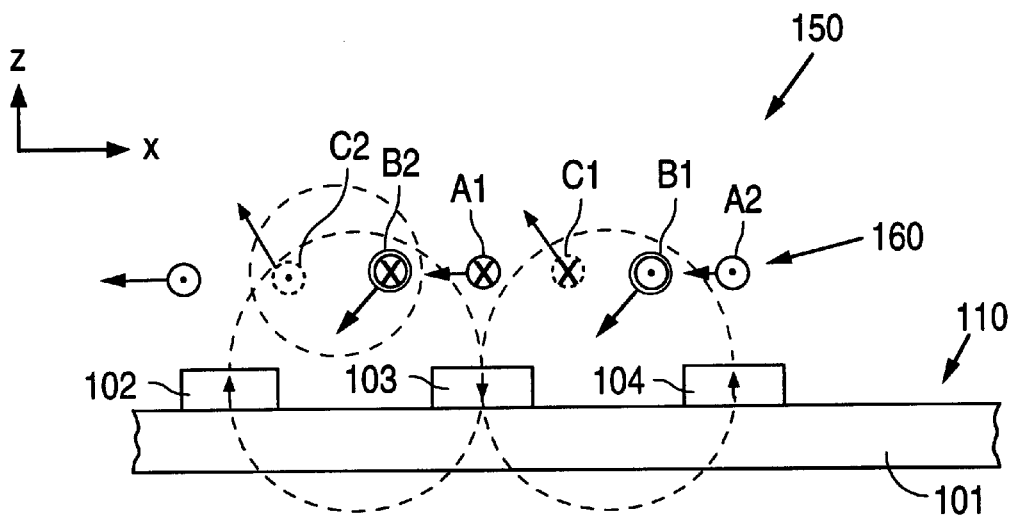
FIG. 1D is a cross-sectional elevation view of a planar motor 150 relative to coordinate arrows X, Z, illustrating three-phase X commutation.

FIG. 1D is a cross-sectional elevation view of a planar motor 150 relative to coordinate arrows X, Z. Planar motor 150 includes a magnet array 110 having magnets 102, 103, and 104 mounted on magnetic circuit material 101 similar to FIGS. 1A and 1B. The polarity of each magnet is shown by the arrows within each magnet. As in FIGS. 1A and 1B, the magnetic flux path of magnet array 110 is indicated by the dashed lines on FIG. 1D. Planar motor 150 further includes a coil array 160 having for simplicity six wires A1, A2, B1, B2, C1, and C2 distributed among three different phases A, B, C, with two wires per phase. As shown in FIGS. 1A and 1B, a central solid dot on a wire indicates electric current flow in the +Y direction out of the plane of the figure, whereas a cross on a wire indicates electric current flow in the −Y direction into the plane of the figure. Paired wires of the same phase have oppositely directed current, since they are portions of a single continuous current loop. Thus wires A1, B1, and C1 have oppositely directed current from wires A2, B2, and C2 respectively. In accordance with the Lorentz law, the electromagnetic force on wires A1, A2, B1, B2, C1, and C2 acts in the direction shown by the arrows pointing from the respective wires. Forces on wires of phase A act exclusively in the X direction. Wires of the B and C phases, however, all have Z components of electromagnetic force. Of importance, in the X commutation configuration of FIG. 1D, the +Z force components acting on wires C1 and C2 of phase C are identically canceled by the −Z force components acting on wires B1 and B2 of phase B, leaving only net X force components on coil array 160. In other commutation configurations, X force components are identically canceled between phases, leaving only net Z force components.

Figure 2:
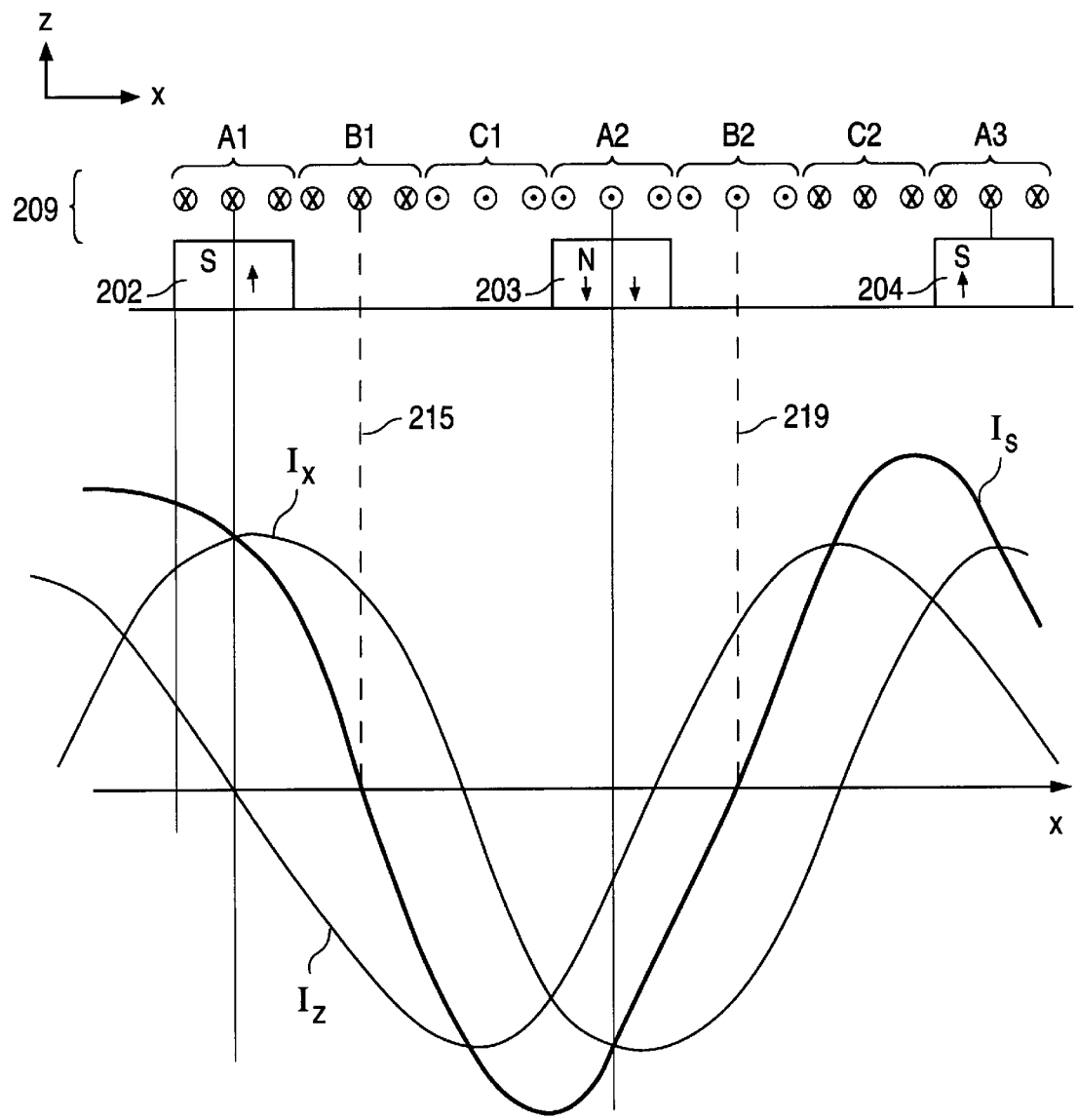
FIG. 2 is a cross-sectional view of a planar motor with a three-phase coil array 209 illustrating the superposition of X and Z commutation currents, in accordance with an embodiment of the invention.

FIG. 2 is a cross-sectional view of a planar motor with a three-phase coil array 209, in accordance with an embodiment of the invention. Aligned with coil array 209 in the lower portion of FIG. 2 is a graphic representation of the current components through the corresponding coil phases. The current shown in FIG. 2 is the current through any phase as a function of that phase's position in the X direction. In an embodiment having coils of more than one phase, when the electric current Ix is reduced for one phase, a similar electric current Ix is typically increased for another phase. This prevents coil array 209 from traveling with uneven speeds. Similarly, when electric current Iz is reduced for one phase, it is typically increased for another phase, thus preventing coil array 209 from oscillating up and down in elevation with changing current Iz.

As shown in the lower portion of FIG. 2, both the X current Ix and the Z current Iz follow sinusoidal waveforms. X current Ix has a positive maximum near magnet 202, and a negative maximum near magnet 203. Z current Iz has a negative maximum at an X position equidistant between magnets 202 and 203, and a positive maximum at a position equidistant between magnets 203 and 204. The amplitudes of Ix and Iz are selected independently of one another and depend on the required force in the X and Z directions respectively. Accordingly, the amplitudes of Ix and Iz in FIG. 2 are shown as equal by way of example only. When the currents of all three phases of coil array 209 are sequentially commutated according to the illustrated Ix and Iz curves, coil array 209 travels in a level horizontal plane at a steady speed.

The superposition of currents Ix and Iz is represented graphically as superposition current Is in the lower portion of FIG. 2. In this example, the waveform of Is is the result of superposition of equal current amplitudes Ix and Iz. In other embodiments, differing amplitudes of Ix and Iz waveforms result in differing amplitudes and waveforms of superposition current Is. In the example of FIG. 2, for coil array 209 to travel from left to right while maintaining a level attitude, superposition current Is has a positive maximum between magnets 203 and 204, at a position closer to magnet 204 than to magnet 203. Superposition current Is has a negative maximum between magnets 202 and 203, at a position closer to magnet 203 than to magnet 202.

Shown in FIG. 2 are the phases A, B, and C of coil array 209. Each phase is represented by coil units in the form of wire loops, for example, as described below in connection with FIGS. 9A–9D. All wires of the same phase carry the same instantaneous current. Thus for phase A in this embodiment, there is a leg A1 and a leg A2. When electric current flows into the plane of the figure at leg A1, because the coil unit is in the form of a continuous loop, electric current flows out of the plane of the figure at leg A2. Phase A3, shown in the upper right portion of FIG. 2, is centered above magnet 204 and carries the same instantaneous current as phase A1, since it is commutated with Phase A. A desired electric current configuration can be found by correlating the location of a phase with the sinusoidal curve of superposition current Is. For example, vertical line 215 corresponds to a position on the superposition current Is waveform that has zero current, and thus a phase centered at a position traversed by vertical line 215 should have zero current. Phase B1 approximates this desired position. Likewise vertical line 219 corresponds to another position on superposition current Is waveform having zero current. Phase B2 approximates this desired position. Because all of the wires B1 and B2 in the same phase B coil unit are commutated together, the current through wires B1 and B2 respectively is the same as for any other wires in the same phase. Accordingly, a zero current Is in both phases B1 and B2 is consistent with the force required for equal X and Z commutation of coil array 209. Thus, in some embodiments, all active coil units of a coil array are simultaneously commutated for X and Z forces by applying a superposition current Is.

Figure 3:
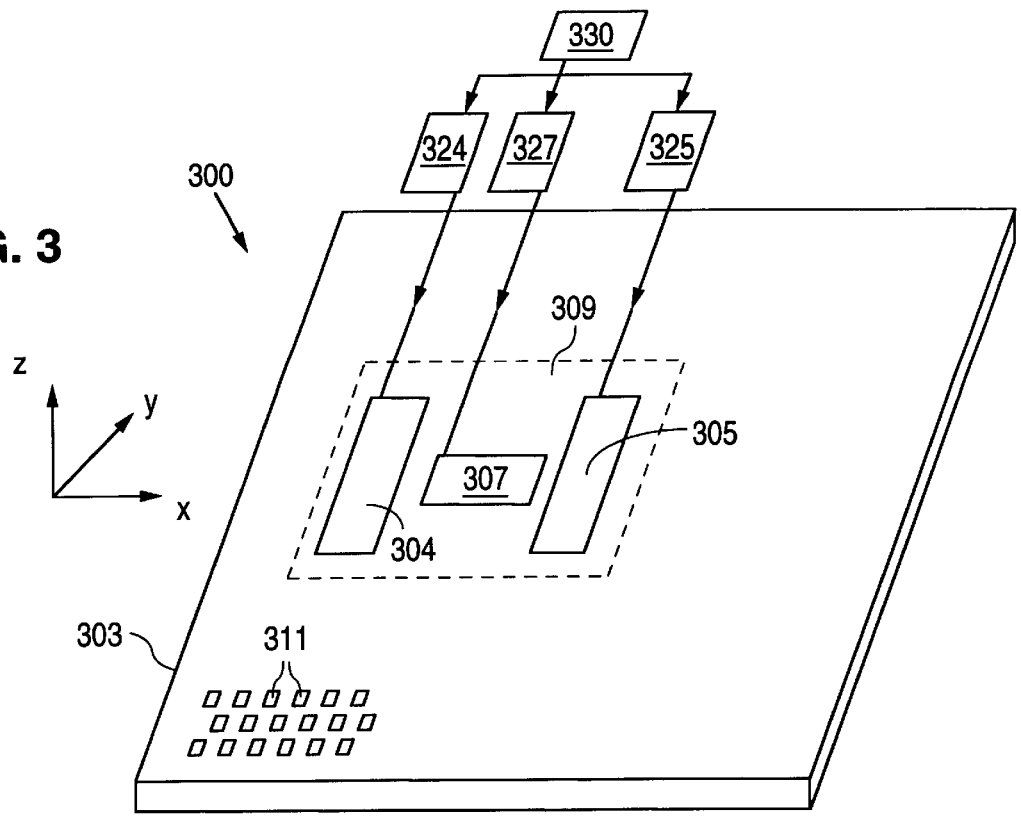
FIG. 3 is a an isometric view schematically showing a moving coil planar motor having three coils, in accordance with the invention.

As shown in FIGS. 1A and 1B, planar motor 100 has a coil for moving in only one horizontal direction, namely the X direction. In some embodiments, a planar motor has coils for movement orthogonal to the X direction as well. FIG. 3 is a an isometric view schematically showing a moving coil planar motor 300 having three coils, in accordance with the invention. Moving coil planar motor 300 includes a flat magnet array 303 having a plurality of magnets 311. A single X coil 307 and two Y Coils 304 and 305 are attached to the underside of a stage frame 309 (drawn in dashed lines) suspended above and parallel to magnet array 303. Y coils 304 and 305 are similar in structure to one another and have coil wires oriented to provide force substantially in a Y direction. X coil 307 and Y coils 304, 305 are similar in structure, but X coil 307 has coil wires oriented to provide force substantially in an X direction perpendicular to the Y direction.

To provide force to stage frame 309 in the X direction relative to magnet array 303, two phase, three phase, or multiphase commutated electric current is supplied to X coil 307 in a conventional manner by a commutation circuit and current source 327. To provide force to stage frame 309 in the Y direction, two phase, three phase, or multiphase commutated electric current is supplied to either one or both of the Y coils 304 and 305 in a conventional manner by respective commutation circuits and current sources 324 and/or 325. To provide rotational torque to frame 309 relative to magnet array 303 in a horizontal plane parallel to the X and Y axes, commutated electric current is supplied to either of Y coils 304 or 305 individually be respective commutation circuits and current source 324 or 325. Alternatively, electric current is supplied to both Y coils 304 and 305 simultaneously but with opposite polarities by respective commutation circuits and current sources 324 and 325, providing Y force to one of Y coils 304, 305 in one direction and the other Y coil 304, 305 in an opposite direction, thereby generating a torque about an axis normal to the XY plane. This torque typically causes rotation of stage frame 309 in the XY plane. Alternatively, in some embodiments the torque causes translation of stage frame 309 having a center of mass offset from its geometric center.

Commutation circuits and current sources 324, 325, and 327 are controlled by a conventional motor control module 330, providing logic signals for directing the operation of planar motor 300. Connecting leads between motor coils 304, 305, 307, and their corresponding commutation circuits and current sources 324, 325, 327 each comprise a plurality of electric wires, distributing current selectively through the individual coil phases.

Figure 4:
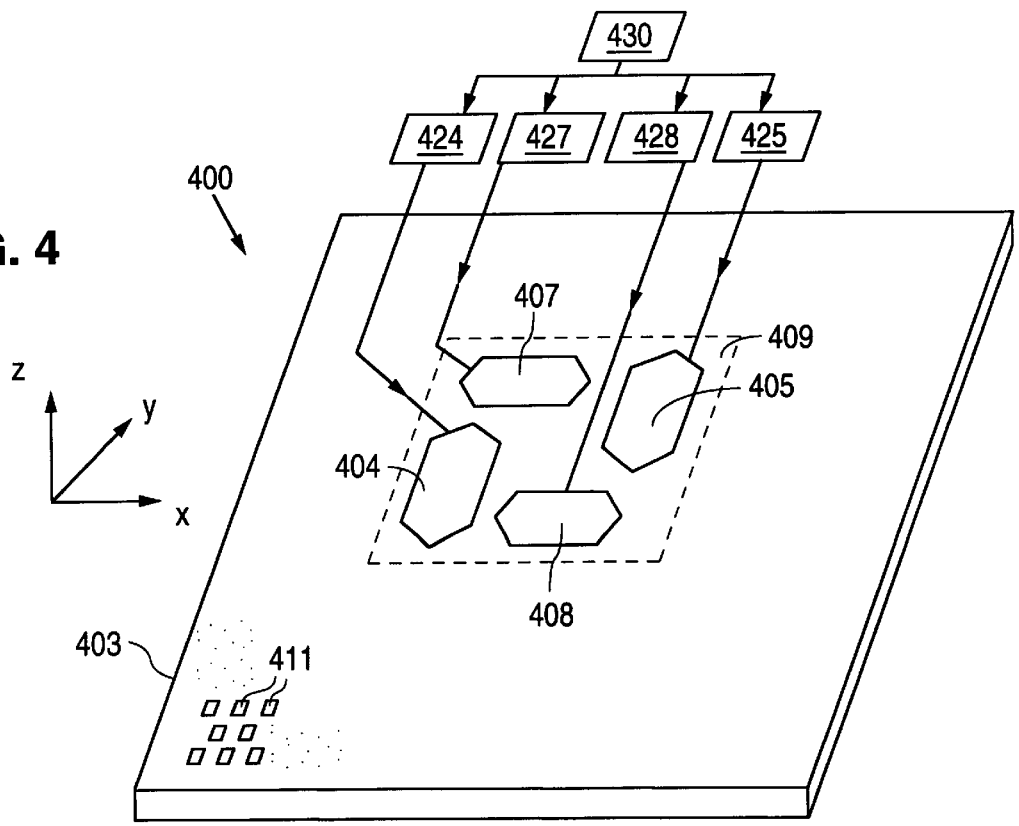
FIG. 4 is an isometric view schematically showing a moving coil planar motor having four coils arranged into two sets of paired coils, according to an embodiment of the invention.

FIG. 4 is an isometric view schematically showing a moving coil planar motor having four coils arranged into two sets of paired coils, according to an embodiment of the invention. Planar motor 400 comprises a flat magnet array 403 having a plurality of magnets 411. Illustratively magnets 411 are configured in a checkerboard pattern, as described in detail below in connection with FIG. 5. X coils 407 and 408 and Y coils 404 and 405 are attached to the underside of a stage frame 409 (drawn in dashed lines). Coils 404, 405, 407, and 408 are similar in structure to one another and are oriented in differing directions. Y coils 404 and 405 are oriented so that their coil wires are aligned perpendicular to the Y direction. X coils 407 and 408 are oriented so that their respective wires are aligned perpendicular to the X direction.

To move stage frame 409 in the X direction relative to magnet array 403, two phase, three phase, or multiphase commutated electric current is supplied to X coils 407 and 408 in a conventional manner by respective commutation circuits and current sources 427 and 428. To move stage frame 409 in the Y direction, two phase, three phase, or multiphase commutated electric current is passed through either one or both of Y coils 404 and 405 in a conventional manner by respective commutation circuits and current sources 424 and 425. To rotate stage frame 409 in the horizontal XY plane, appropriately commutated electric current of the required polarity is supplied to any one or more of coils 404, 405, 407, and 408 by the corresponding commutation circuit and current source 424, 425, 427, and 428. Alternatively rotation is achieved by energizing pairs of coils 404, 405 or 407, 408 in opposition, or by appropriately energizing both sets of coil pairs 404, 405, and 407, 408 in opposition by their corresponding commutation circuits and current sources 424, 425, 427, 428. As described above in connection with FIG. 3, commutation circuits and current sources 424, 425, 427, 428 are controlled by a conventional motor control module 430. In planar motor embodiments 300 and 400 as illustrated in FIGS. 3 and 4, the various coil sets can be rearranged geometrically without departing from the spirit or scope of the invention.

In some embodiments, moving coil motors 300 and 400 of FIGS. 3 and 4 respectively are made in an iron free implementation, in which the entire moving stage is nonmagnetic. This is beneficial for reducing detent forces and preventing magnetic attraction to the magnet array, but does not provide the highest electromagnetic forces. In some embodiments, the stages of motors 300 and 400 are made with a flat sheet of iron backing the coils. Alternatively, motors 300 and 400 have coils inserted into slots in an iron backing plate. In the latter two configurations, electromagnetic force is increased, and attractive magnetic forces preload the air bearings.

Alternative embodiments to motors 300 and 400 of FIG. 3 and FIG. 4 are motors equipped with air bearings. For example, air bearings are installed and operated in a conventional fashion at the four corners of a stage so that the stage floats on an air cushion above magnet array 303, even when the coils are not commutated for producing Z direction force. Motors using these alternative embodiments do not require commutation for generating Z direction force. However, motors of these alternative embodiments cannot produce motion in the Z direction, and thus are confined to three degrees of freedom only. Using motors of these alternative embodiments, movement in the X and Y directions and rotation in the plane defined by the X and Y axes are possible. Air bearings are well known in the art of planar motors (see for example Hinds '571, cited above, and Sawyer US Re. No. 27,436 reissued Jul. 18, 1972).

Figure 5:
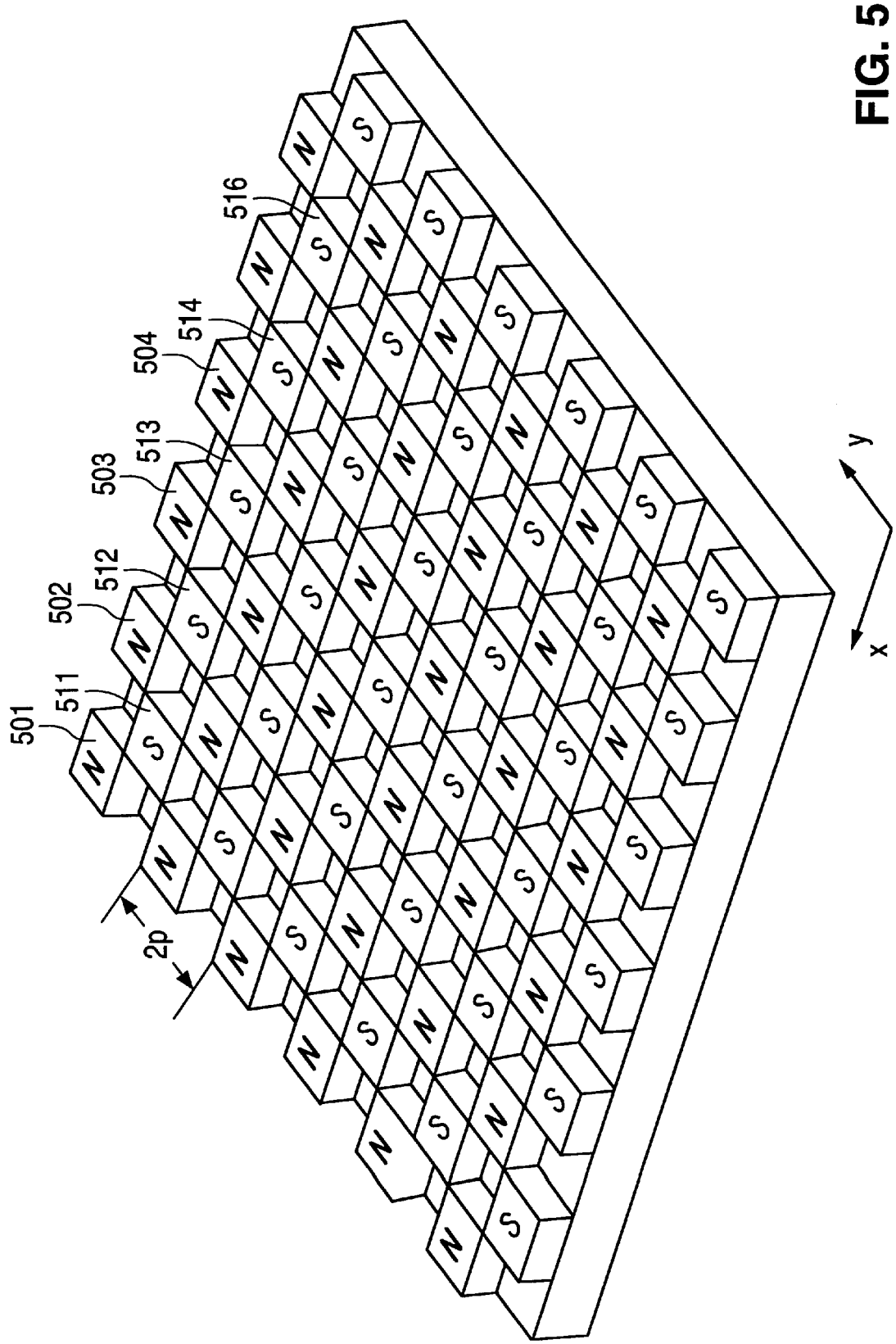
FIG. 5 is an isometric view showing a magnet array configured for a planar motor.

FIG. 5 is an isometric view showing a magnet array configured for a planar motor, illustratively motors 300 and 400 shown in FIGS. 3 and 4. The magnets form rows in the X direction and columns in the Y direction as defined by X and Y coordinate arrows, and are arranged in a staggered checkerboard fashion. The polar axes of all magnets in the array are aligned parallel to the Z direction (perpendicular to the X-Y coordinate plane). The magnets within any row or column have the same polarity. For example, magnets 501–504 all have the N poles facing out ("N magnets" hereinafter), and magnets 511–516 all have S poles facing out ("S magnets" hereinafter). The magnets are all equal in size and square in cross-section, although magnets of other shapes are also possible. In some embodiments, the magnets are rectangularly shaped, while in some embodiments, the magnets are octagonally shaped (as described in connection with FIG. 8 below). In the X direction there are 12 rows of magnets including 6 rows of N magnets and 6 rows of S magnets. In the Y direction, there are 12 columns of magnets including 6 columns of N magnets and 6 columns of S magnets. In some embodiments, particularly those involving moving coil motors, the numbers of rows and columns in a magnetic array are substantially larger, providing for a larger desired range of travel. In some embodiments, the number of rows and the number of columns are unequal.

Magnetic pitch is the distance from the center of a "N magnet" to the center of the next adjacent "S magnet" parallel to a row or column of a magnet array. In an array of rectangularly shaped magnets, for example, an X direction magnetic pitch Px of the array is the distance between adjacent "N magnet" and "S magnet" centers parallel to the X direction. For a square array of magnets, the magnetic pitch P of the magnet array is the distance between adjacent "N magnet" and "S magnet" centers parallel to either X or Y axis. The square magnet array of FIG. 5 includes 12 rows and 12 columns of magnets, and has a pitch P such that the combined length of an adjacent "N magnet" and "S magnet" equals 2P.

Figure 6:
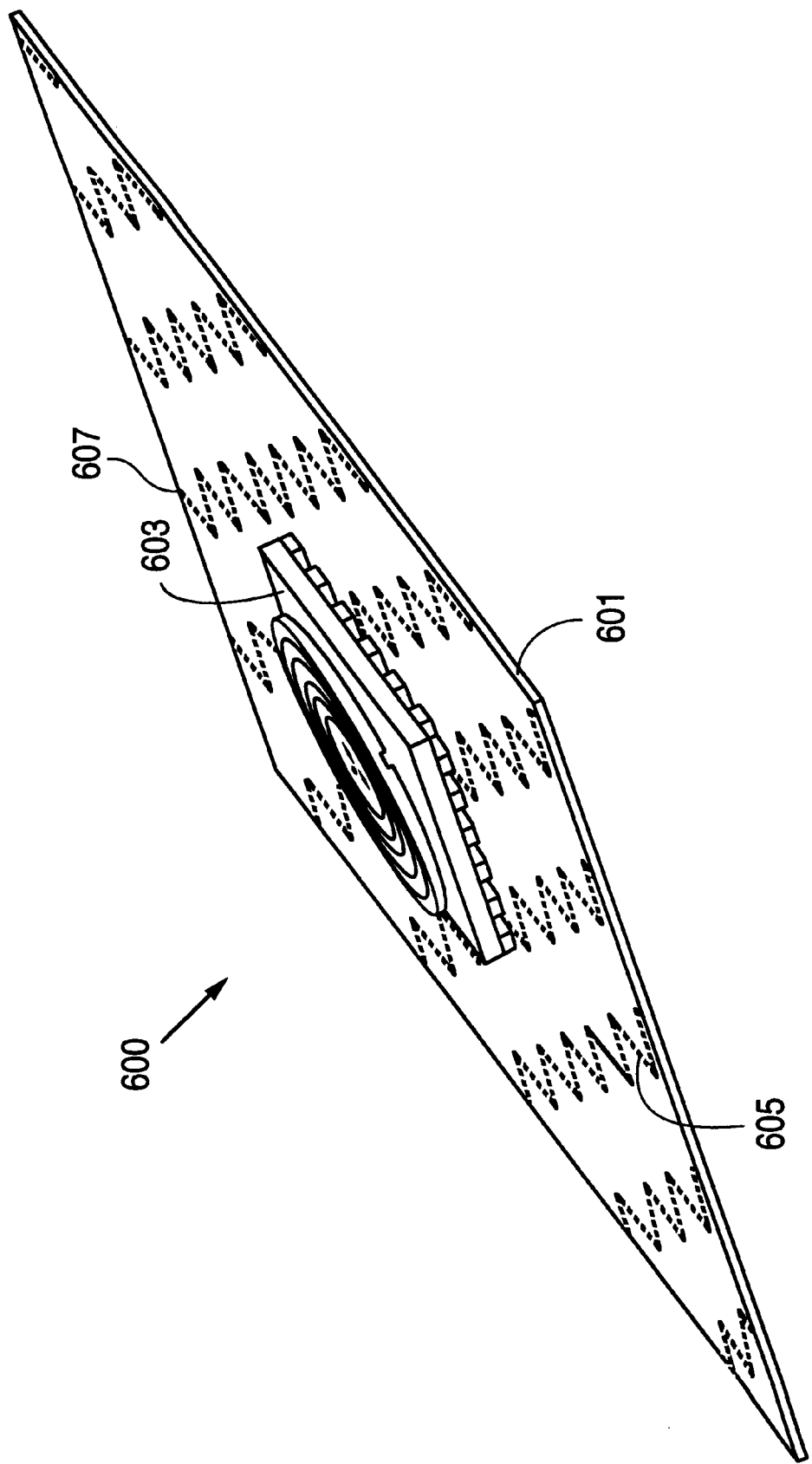
FIG. 6 is an isometric view illustrating a moving magnet planar motor, in accordance with the invention.

The principles in accordance with the invention are also applied to make a planar motor having a moving magnet configuration. FIG. 6 is an isometric view illustrating a moving magnet planar motor 600, in accordance with some embodiments. The entire upper surface of a flat base 601 is covered with coil units 605. A positioning stage 603 is suspended above flat base 601 and has an array of magnets 607 facing the upper surface of flat base 601. A conventional commutation circuit (not shown) supplies electric current to coil units 605 in accordance with the desired direction of travel of positioning stage 603. Appropriately commutated electric current creates Lorentz forces, which propel positioning stage 603 to a desired location, altitude, and attitude.

In some embodiments, to help suspend positioning stage 603 above flat base 601, lifting permanent magnets 118 and corresponding hoist permanent magnets 119 (see FIG. 1A) are installed respectively on the upper surface of positioning stage 603 and on a stationary frame located above positioning stage 603. Hoist and lifting permanent magnets 119, 118 do not require electric current, and thus reduce or eliminate the electric current needed to generate Z direction force for suspension of positioning stage 603, consequently reducing energy consumption and heat generation. In some embodiments hoist and lifting magnets replace Z force commutation as a means for suspending positioning stage 603 against gravity. Alternatively individual horizontally or vertically oriented lifting magnets are paired with iron plates, as shown in FIG. 1C, to provide an attractive magnetic force to suspend positioning stage 603 against gravity. In some embodiments hoist and lifting magnets augment air bearings as a means for suspending positioning stage 603 against gravity. In further embodiments hoist and lifting magnets augment Z force commutation as a means for suspending positioning stage 603 against gravity, permitting motion of positioning stage 603 over six degrees of freedom.

Figure 7:
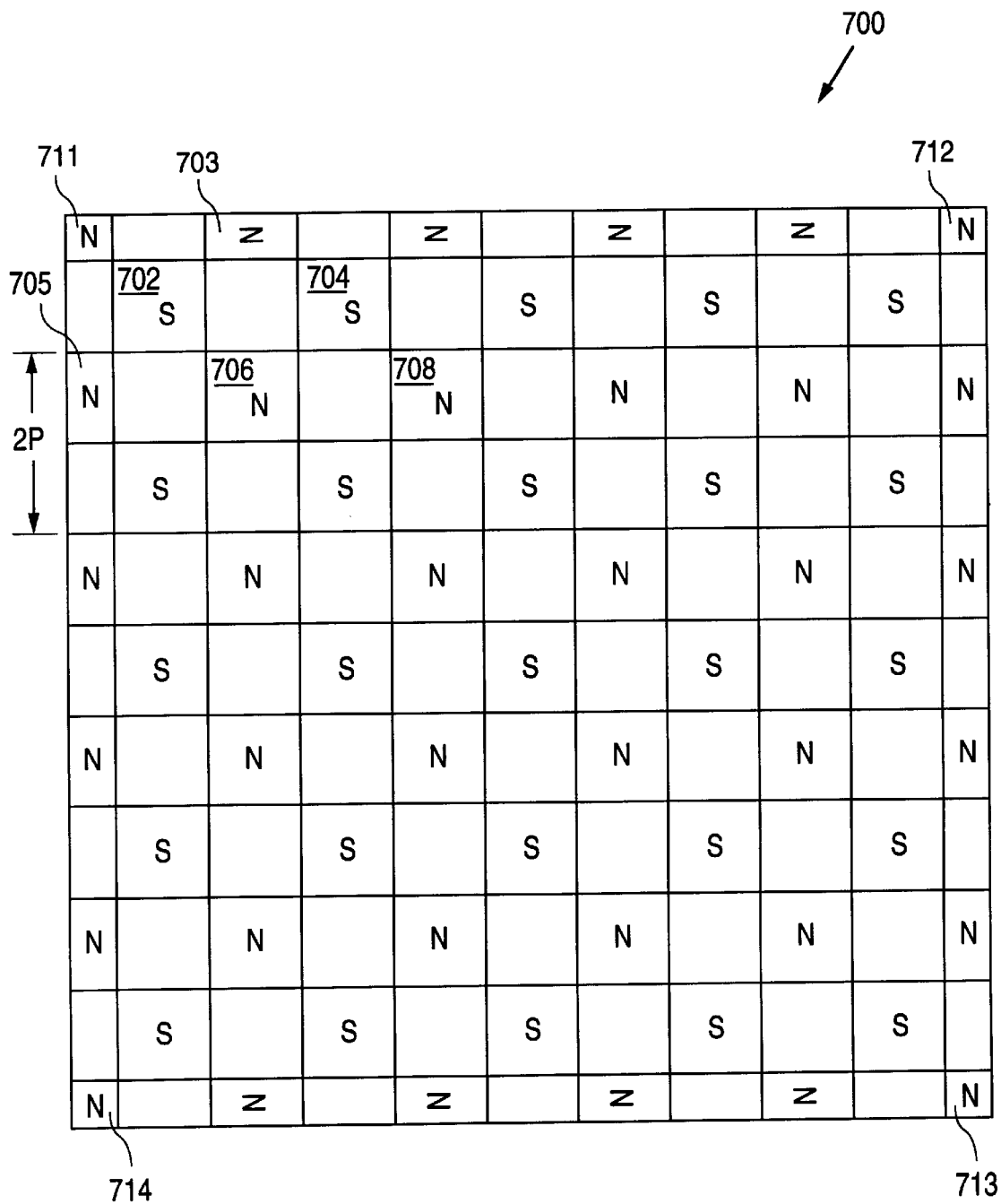
FIG. 7 is a plan view of a magnet array on a stage for a moving magnet planar motor.

FIG. 7 is a plan view of a magnet array 700 on a stage for a moving magnet planar motor. Illustratively magnets 702, 704, 706, and 708 in the central portion of array 700 are full sized square magnets. At the four corners of magnet array 700, magnets 711–714 generate substantially one-quarter of the magnetic flux of full sized magnets 702, 704, 706, and 708 and are known as "quarter magnets." The magnets at the outermost row or column other than those at the four corners generate a magnetic flux that is substantially half that of the full sized magnets 702, 704, 706, and 708 and are thus called "half magnets." The full sized S magnets and N magnets (see FIG. 5) are equal in size. The magnetic pitch of the array is the distance along a particular axis between centers of adjacent full sized S and N magnets. Of importance, half magnets and quarter magnets along the perimeter of moving magnet array 700 optimize the efficiency of the magnet array for providing magnetic flux. For example, full sized S magnet 702 can be considered as four quarter magnet segments. Each quarter magnet segment of S magnet 702 is coupled with an adjacent N quarter magnet segment, namely quarter magnet 711, the closest quarter magnet segment of full sized magnet 706, and the closest quarter magnet segments of half magnets 703 and 705. Similarly across the entire magnet array, every quarter magnet segment of every full sized S magnet is coupled with a nearest neighbor N quarter magnet segment. Without the perimeter of quarter and half magnets, the perimeter would consist of sides of S magnet segments having no coupled nearest neighbor N magnet segments, and therefore not efficiently providing magnetic flux. In some embodiments, the polarities of the respective magnets of magnet array 700 are reversed, such that the perimeter of the array is lined with S polarity half magnets and quarter magnets.

Figure 8A:
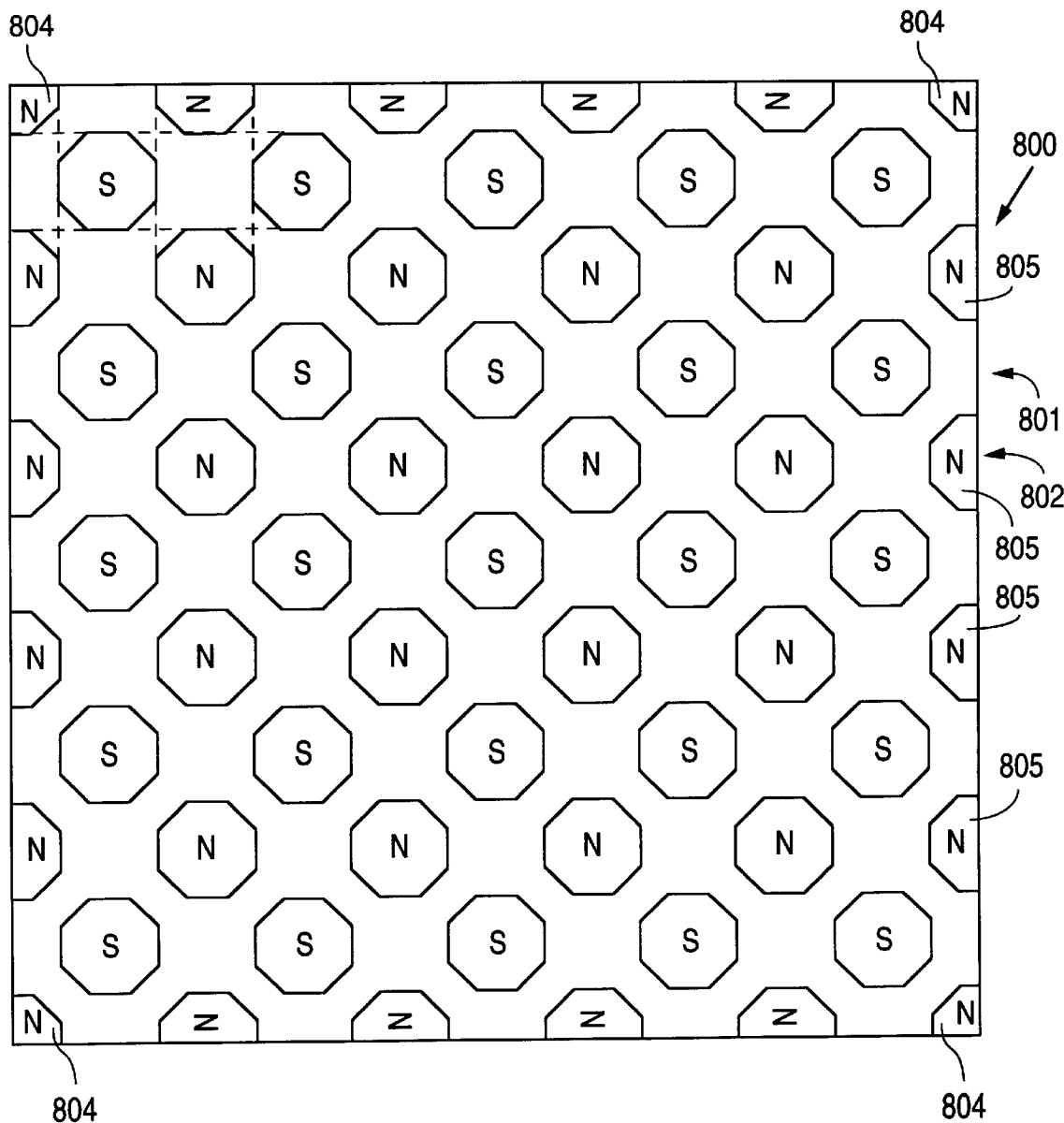
FIG. 8A is a plan view of a moving magnet array, in accordance with some embodiments of the invention.

FIG. 8A is a plan view of a moving magnet array 800, as in some embodiments of the invention. In this embodiment, octagonal magnets replace the square magnets of FIG. 7. As shown by the dashed lines in FIG. 8A, the surface area of an octagonal magnet is smaller than that of a square magnet with equal pitch P=Px=Py. As with magnet array 700 in FIG. 7, magnet array 800 of FIG. 8A has quarter magnets 804 and half magnets 805. Additionally, magnet arrays 700 and 800 have "long rows" with 5 full sized magnets and no half magnets, such as row 801, alternating with "short rows" with 4 full magnets and two half magnets, such as row 802.

FIG. 8B is a plan view of a two-by-two type of moving magnet array 810. By way of example, moving magnet array 810 is mounted to the underside of a stage frame carrying a semiconductor wafer (indicated as a dashed circle). Two magnet assemblies 812, 814 of rectangular magnets aligned parallel to the Y-axis and having a magnetic pitch Py and two magnet assemblies 816, 818 of rectangular magnets aligned parallel to the X-axis orthogonal to the Y-axis and having a magnetic pitch Px.

FIGS. 9A, 9B, and 9C are respectively a plan view, an edge view, and an isometric view of a hexagonally shaped coil unit 900 for a planar motor, in accordance with the invention. The apparatus and method for making this coil unit are described in Hazelton et al., "Linear Motor Having Polygonal Shaped Coil Units", US application Ser. No. 09/059,056, filed Apr. 10, 1998, and incorporated herein by reference in its entirety. Coil unit 900 has legs 902 surrounding a central void 905. Illustratively, for a three-phase commutated linear motor, the preferred width of void 905 is twice the width of leg 902. In addition to hexagonally shaped coil unit 900 shown in FIGS. 9A–9C, other shapes including diamond, double diamond, and parallelogram polygonal shapes are applicable to embodiments of the invention, as illustrated in FIG. 9D by a diamond shape coil unit 910.

Figure 9F:
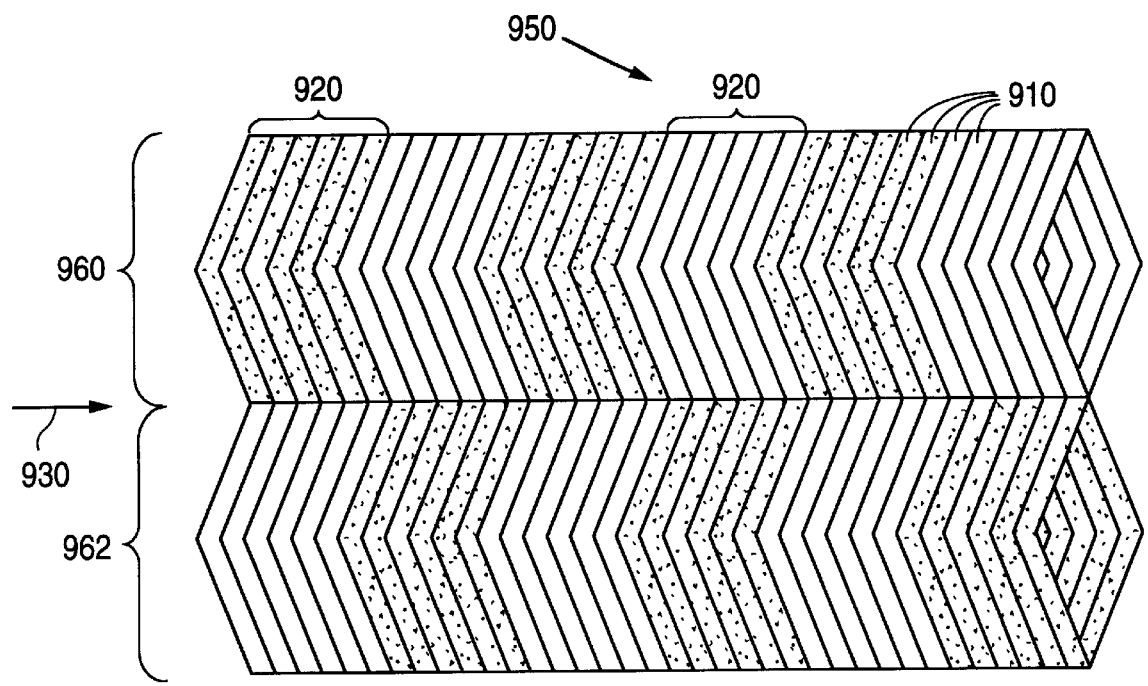

FIGS. 9D–9G are plan views showing the structure and application of various coil units, in accordance with the invention. To construct a planar motor coil, a row 920 of partially overlapped coil units 910 is first assembled parallel to a longitudinal axis 930, as shown in FIG. 9E. In this case row 920 comprises six coil units, two coil units for each of three phases. The number of coil units in a row can be different, depending on the number of phases of the motor and the choice of coil units per phase. Each phase in row 920 is driven by a separate amplifier of a commutation circuit (not shown).

Figure 9G:
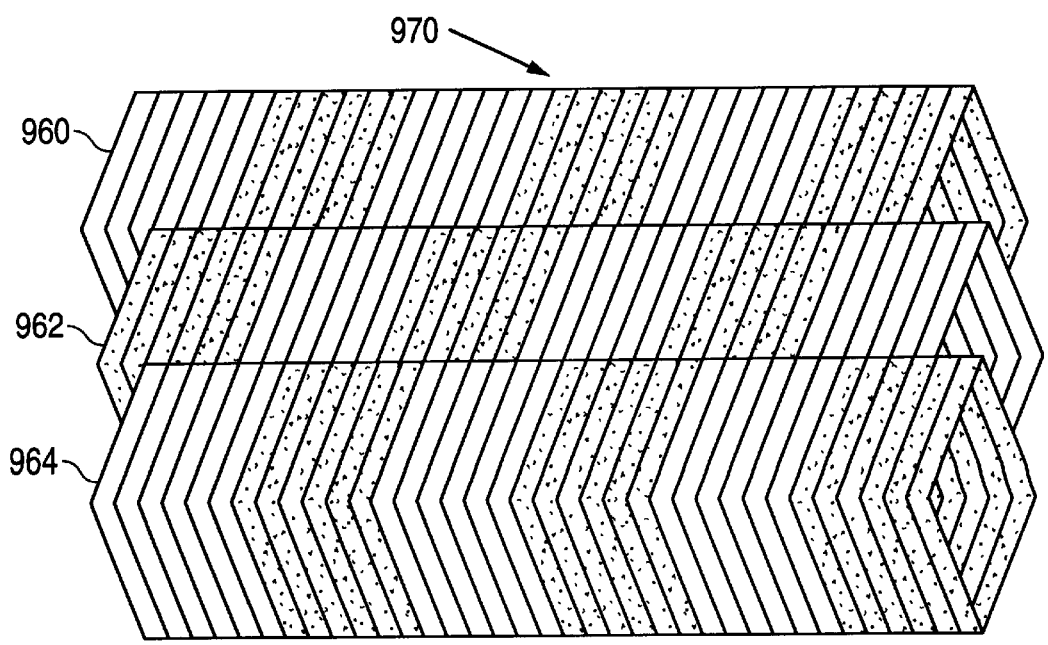

A coil array contains a plurality of rows, such as row 920. FIG. 9F shows one type of coil array, a side-by-side array 950. In coil array 950, rows of coil units 910 are arranged in linear, overlapping coil assemblies 960, 962 parallel to the longitudinal axis 903, and then coil assemblies 960, 962 are arranged side-by-side in a lateral direction non-collinear with longitudinal axis 930. Preferably coil assemblies 960, 962 are arranged side-by-side in a direction orthogonal to longitudinal axis 930. FIG. 9G shows another type of coil array in accordance with the invention, in which three coil assemblies 960, 962, and 964 are overlapped side-by-side to form a laterally overlapped coil array 970. Illustratively coil arrays 950 and 970 comprise two and three coil assemblies respectively. However, in various embodiments any number of coil assemblies are used.

Figure 10A:
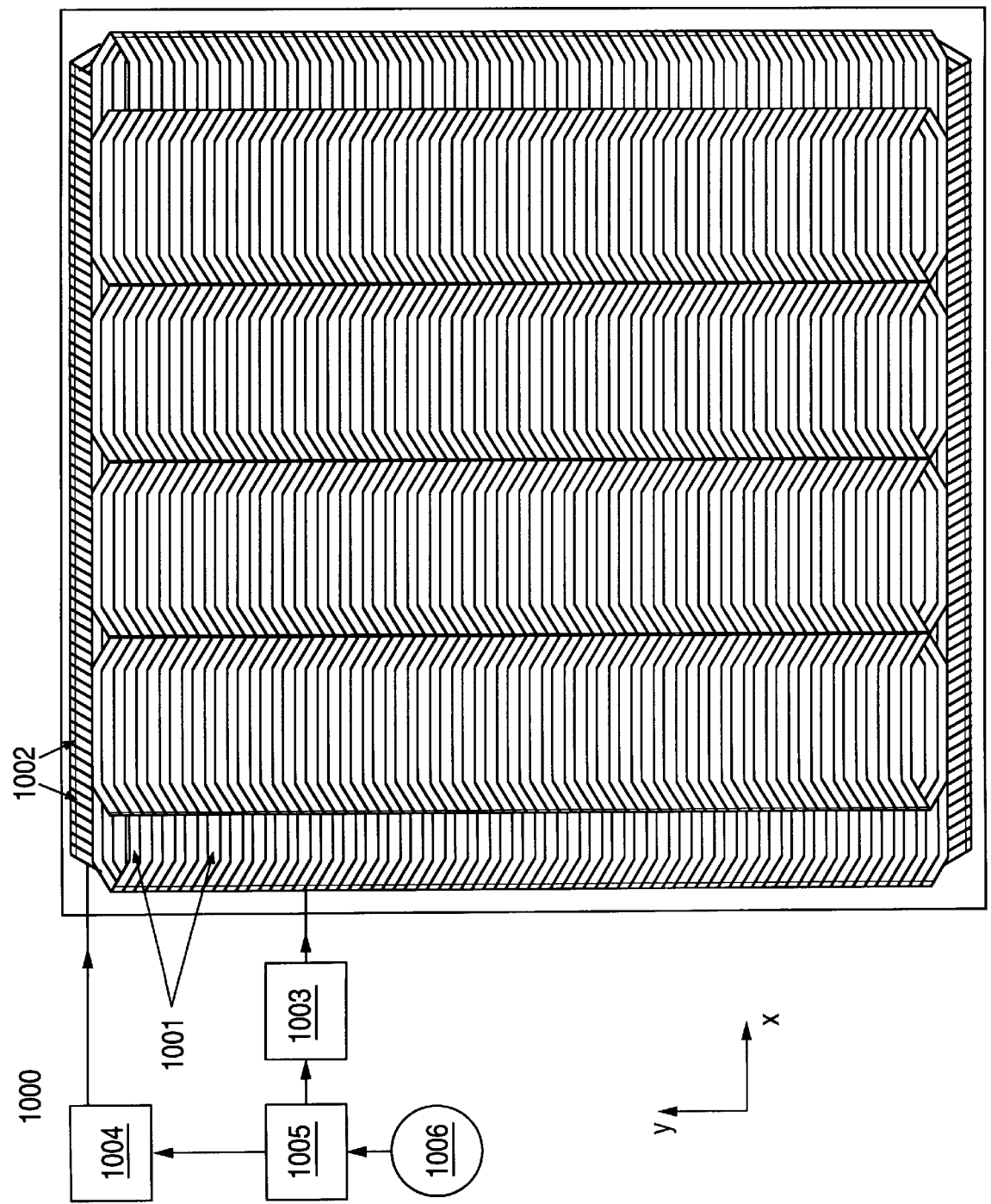
FIG. 10A is a plan view of a base of a moving magnet planar motor, according to the invention.

FIG. 10A is a plan view of a base 1000 of a moving magnet planar motor, according to the invention. Base 1000 includes a plurality of motor coil units such as coil unit 900 of FIG. 9A. For a moving magnet planar motor, the coil array must be as long as the required travel of the positioning stage plus the length of the stage (not shown for clarity), and the coil units must cover substantially the entire area of base 1000. In FIG. 10A, coil units are arranged into an X-layer for propulsion in the X direction and a Y-layer for propulsion in the Y direction, as denoted by the coordinate arrows. Illustratively, the Y layer is stacked on top of the X layer vertically in the Z direction (perpendicular to X and Y directions). Coil units 1001 are arranged to provide Y direction propulsion, so have legs oriented principally perpendicular to the Y direction. Similarly, coil units 1002 (stacked beneath coil units 1001) are arranged to provide X direction propulsion, so have legs oriented principally perpendicular to the X direction.

In operation, each coil produces substantially constant force along a respective X or Y linear direction, as shown by arrows in FIG. 10A. To generate force in the Y direction, the Y coils 1001 directly underlying the magnet array of the stage are energized. Similarly, to generate force in the X direction, the X coils 1002 directly underlying the magnet array of the stage are energized. To provide rotation parallel to the XY plane, some coil units in either X or Y coils or both X and Y coils are selectively energized in both directions to generate a torque about an axis oriented in the Z direction. To minimize power consumption and heat generation in some embodiments, only the coils underlying the magnet array are selectively energized. Typically these coils are selected by position feedback sensing of the stage coupled through programmable control logic. Illustratively a feedback signal provides an input 1006 to a motor control module 1005, where it is combined with other control signals. Motor control module 1005 in turn controls the operation of commutation circuits and current sources 1003 and 1004, which supply current selectively to Y coils 1001 and X coils 1002 respectively. In some embodiments, separate amplifiers are used for each control coil group. In some embodiments, separate switching logic circuits are used for each control coil group. Although single connecting leads are shown between commutation circuits and current sources 1003, 1004 and their corresponding Y and X coils 1001, 1002, in some embodiments they represent a plurality of electric wires, enabling commutation circuits and current sources 1003, 1004 to energize each individual coil unit of Y and X coils 1001, 1002 selectively.

Figure 10B:
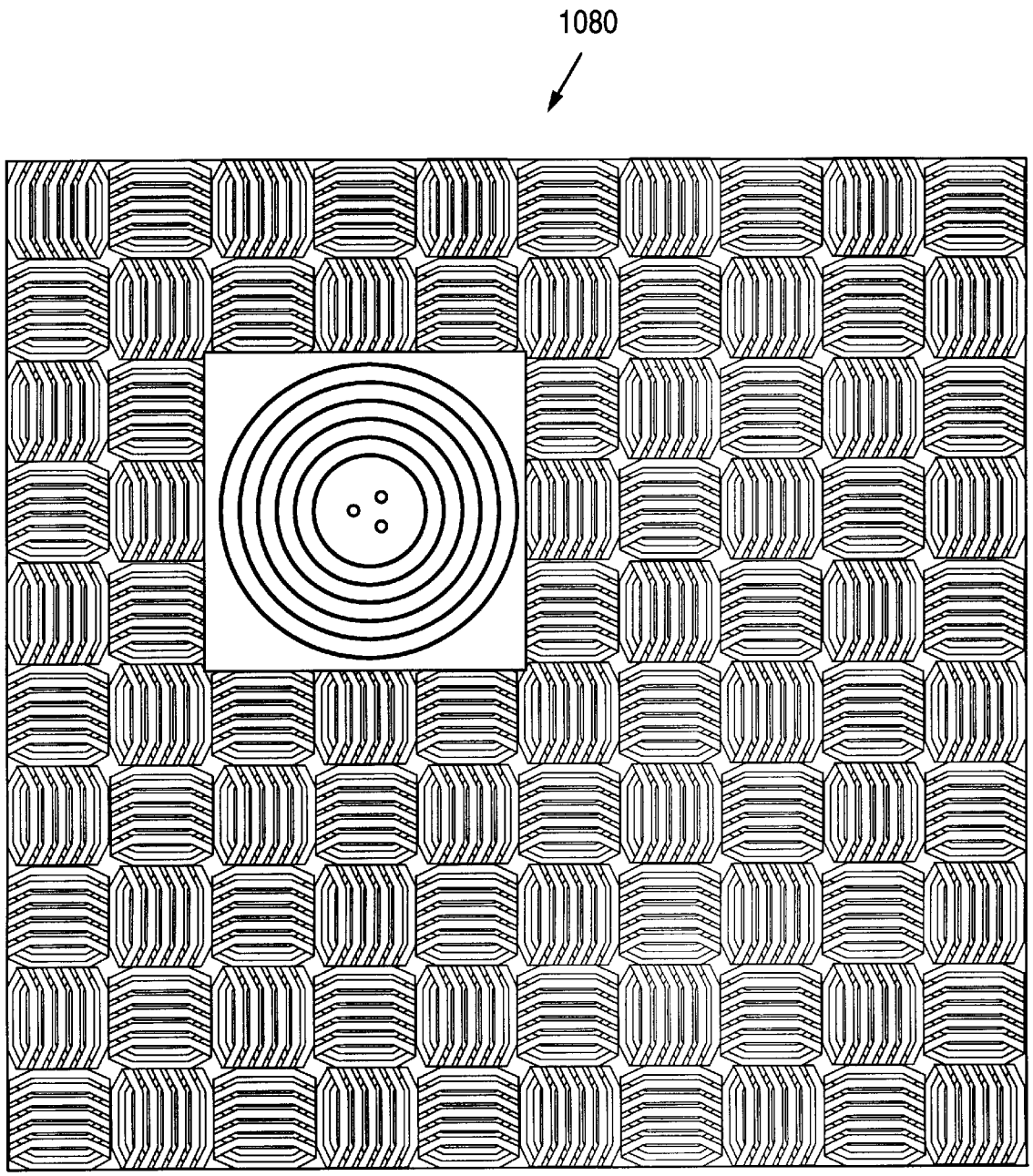
FIG. 10B is a plan view of a moving magnet planar motor having a coil array configuration in which coil units within a single layer are arranged in a checkerboard pattern covering the base.

FIG. 10B is a plan view of a moving magnet planar motor 1080 having a coil array configuration in which coil units within a single layer are arranged in a checkerboard pattern covering the base. Illustratively, within each row and column of the checkerboard, alternating squares contain orthogonally oriented coil units. As shown, there are six coil units within each square, providing two coil units per phase for three-phase commutation. The configuration of planar motor 1080 allows a large range of two-dimensional motion requiring only a single layer coil array, but generates a lower electromagnetic force per unit area than does a multilayer coil array configuration.

Figure 11A:
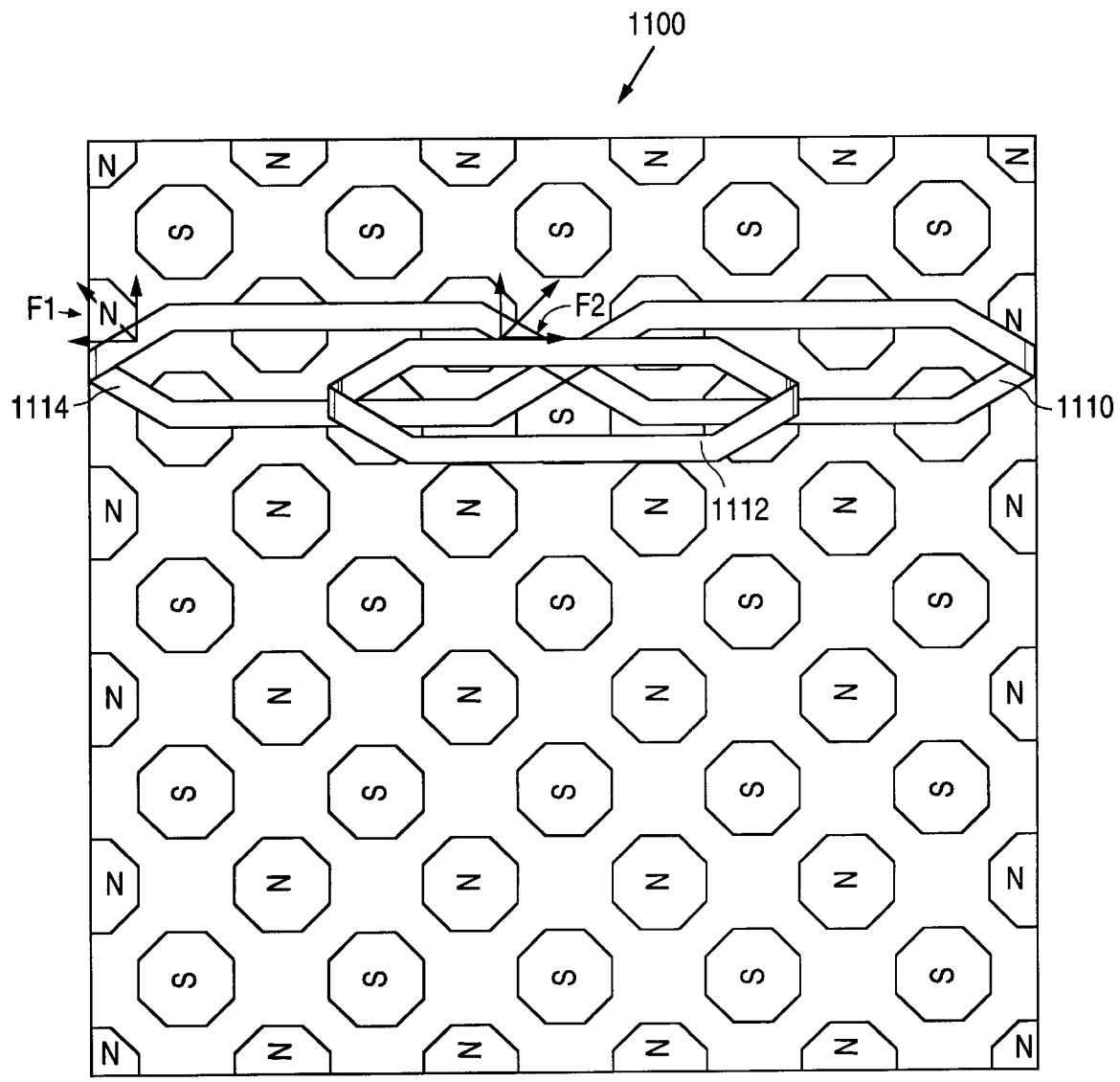
FIG. 11A is a plan view schematically illustrating a magnet array in association with three representative coil units.

FIG. 11A is a plan view schematically illustrating an octagonal magnet array 1100 similar to that shown in FIG. 8A in association with three representative coil units 1110, 1112, 1114 similar to that shown in FIG. 9A. In some embodiments, a coil unit has a preferred length that is an odd integer multiple of the magnetic pitch of an associated magnet array. As shown in FIG. 11A, each coil unit 1110, 1112, 1114 is 5 magnetic pitches long. This arrangement is desirable, because the electromagnetic force component perpendicular to the direction of travel is canceled identically for each individual coil unit, as shown in FIG. 11A. For example, electric current is provided to the coil array for moving the magnet array in the −Y direction relative to the coil units. Thus it is desired that the force acting on coil units 1110, 1112, and 1114 be in the opposite +Y direction. For example, on the slant sections of the legs of coil unit 1114, the force components F1 and F2 are in directions not parallel to +Y direction. Nonetheless, as illustrated in FIG. 11A, the X direction force components F1 and F2 cancel each other identically in pairs, leaving only a net +Y direction force. Similar force component cancellation occurs on coil units 1110 and 1112. In planar motor configurations in which the length of a coil unit is not an odd integer multiple of the magnetic pitch of an associated magnet array, such cancellation of force components perpendicular to the direction of travel generally does not occur.

In some embodiments, when a coil unit is commutated with a proper current configuration in association with a magnet array having proper magnetic pitch, it generates constant electromagnetic force substantially parallel to its longitudinal axis in the XY plane. When the same coil unit is commutated ninety degrees out of phase relative to the previous current configuration, it generates constant electromagnetic force orthogonal to the XY plane. Of importance, in some embodiments each coil unit generates force both parallel to the XY plane and normal to the XY plane. Because coil units are supplied from mutually independent current sources, any coil unit can be independently commutated and can generate force independent of other coil units.

Figure 11B:
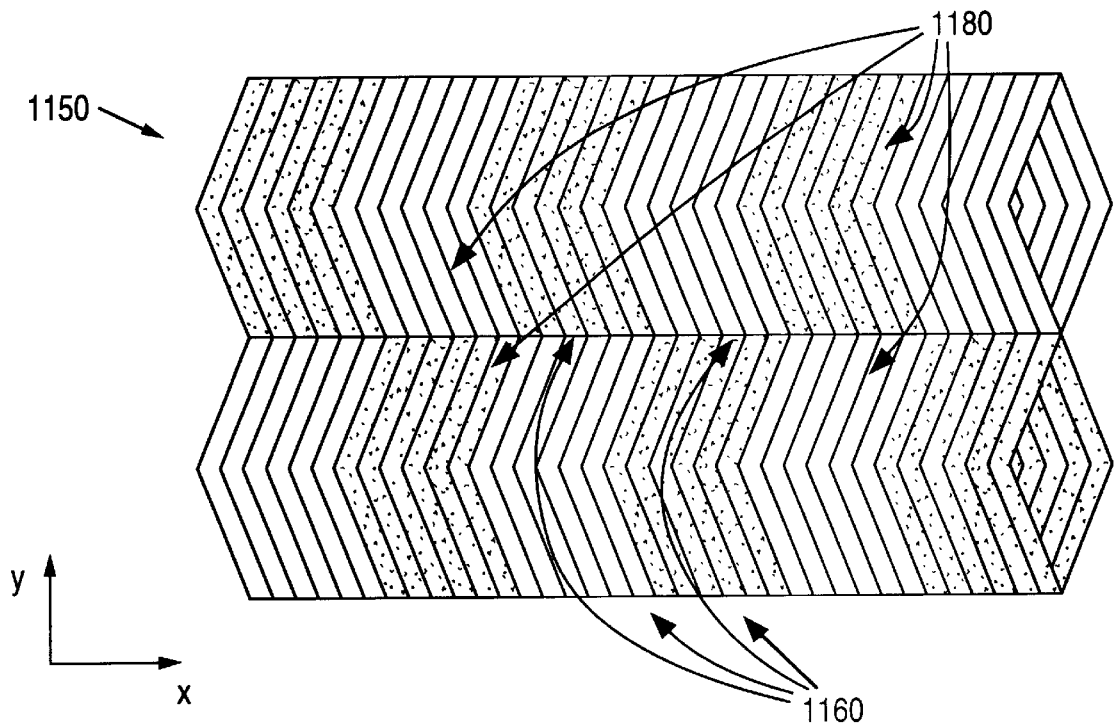
FIG. 11B is a plan view of a coil array for a planar motor having six uncoupled degrees of freedom, as in some embodiments.

FIG. 11B is a plan view of a coil array 1150 for a planar motor having six uncoupled degrees of freedom, as in some embodiments. Coil array 1150 as shown in FIG. 11B is a side-by-side coil array physically similar to coil array 950 described in connection with FIG. 9F. However, the principles described below apply equally to other fixed and moving coil array embodiments, including those depicted in FIGS. 9G, 10A, and 10B. Coil array 1150 is installed in a planar motor without using an air bearing or other bearing system to support the stage against gravity. Instead, the stage (not shown) is supported against gravity by vertical electromagnetic force generated by commutating the coil units of coil array 1150 ninety degrees out of phase. In some embodiments, any individual coil unit selectively generates an instantaneous XY planar force or vertical Z (normal to XY plane) force, but not both simultaneously. For example, with the commutation configuration of FIG. 11B, X coil units 1160 instantaneously generate only X forces and Z coil units 1180 instantaneously generate only Z forces. As commutation proceeds, other phases sequentially generate X and Z forces respectively. Y coils (not shown for clarity) are similarly selectively commutated.

Figure 11C:
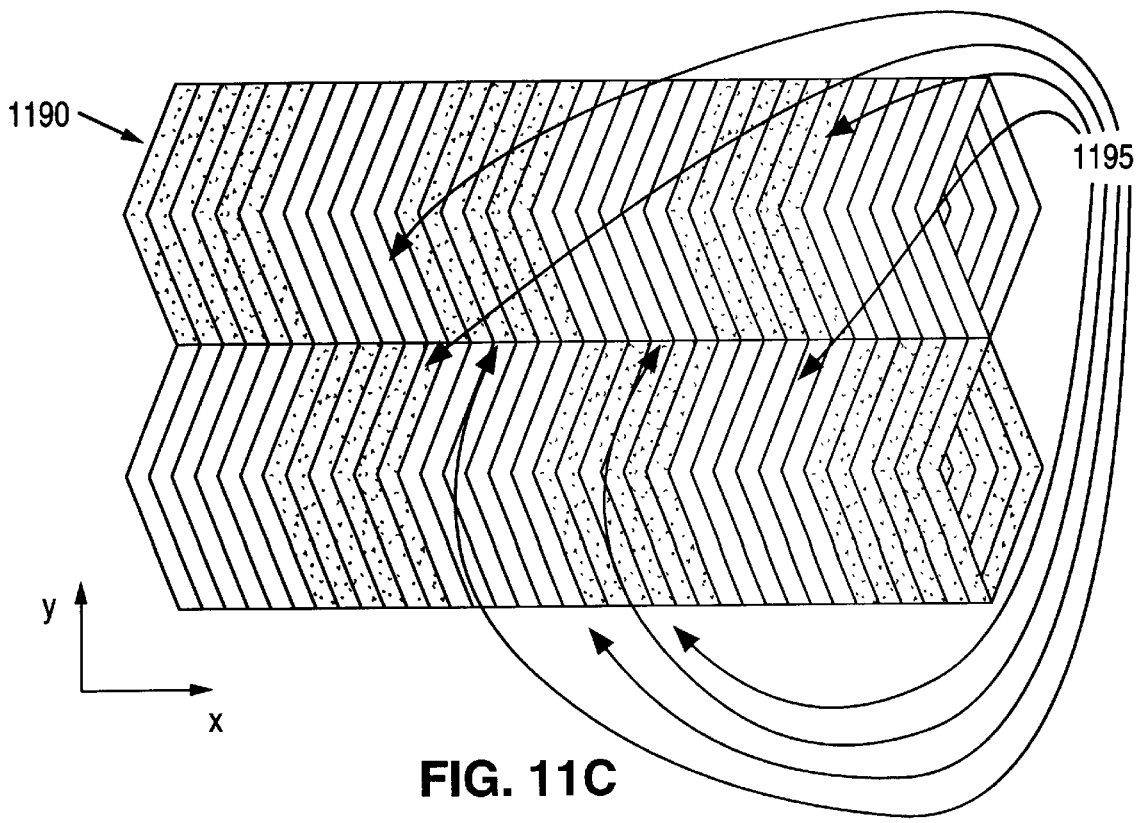
FIG. 11C is a plan view of a coil array for a planar motor having six coupled degrees of freedom, as in some embodiments.

In other embodiments, as depicted in FIG. 11C, a coil array 1190 similar to coil array 1150 is selectively commutated such that any coil unit simultaneously generates both planar (parallel to the XY plane) and vertical (Z) force. This is typically done by combining the planar force and vertical force current signals in the commutation circuitry to provide a superposition signal individually for each coil unit. The coil unit is then selectively driven with a superposition current Is, in a fashion similar to that described in connection with FIG. 2. This provides a planar motor having six coupled degrees of freedom. In the present embodiments, any coil unit is selectively commutated to generate X or Y and Z forces simultaneously, as indicated by arrows 1195. Only selected coil units need to be energized, for example only those coil units instantaneously underlying the stage are energized. Individual X or Y and Z current amplitudes for each coil unit are controlled and superimposed independently, providing flexibility of control and movement. Since the present embodiments permit programmable use of the same coil units for X or Y force and Z force and do not require dedicated coil units for each axis, they provide for more efficient use of coil units than do planar motors having six uncoupled degrees of freedom.

Figure 12:
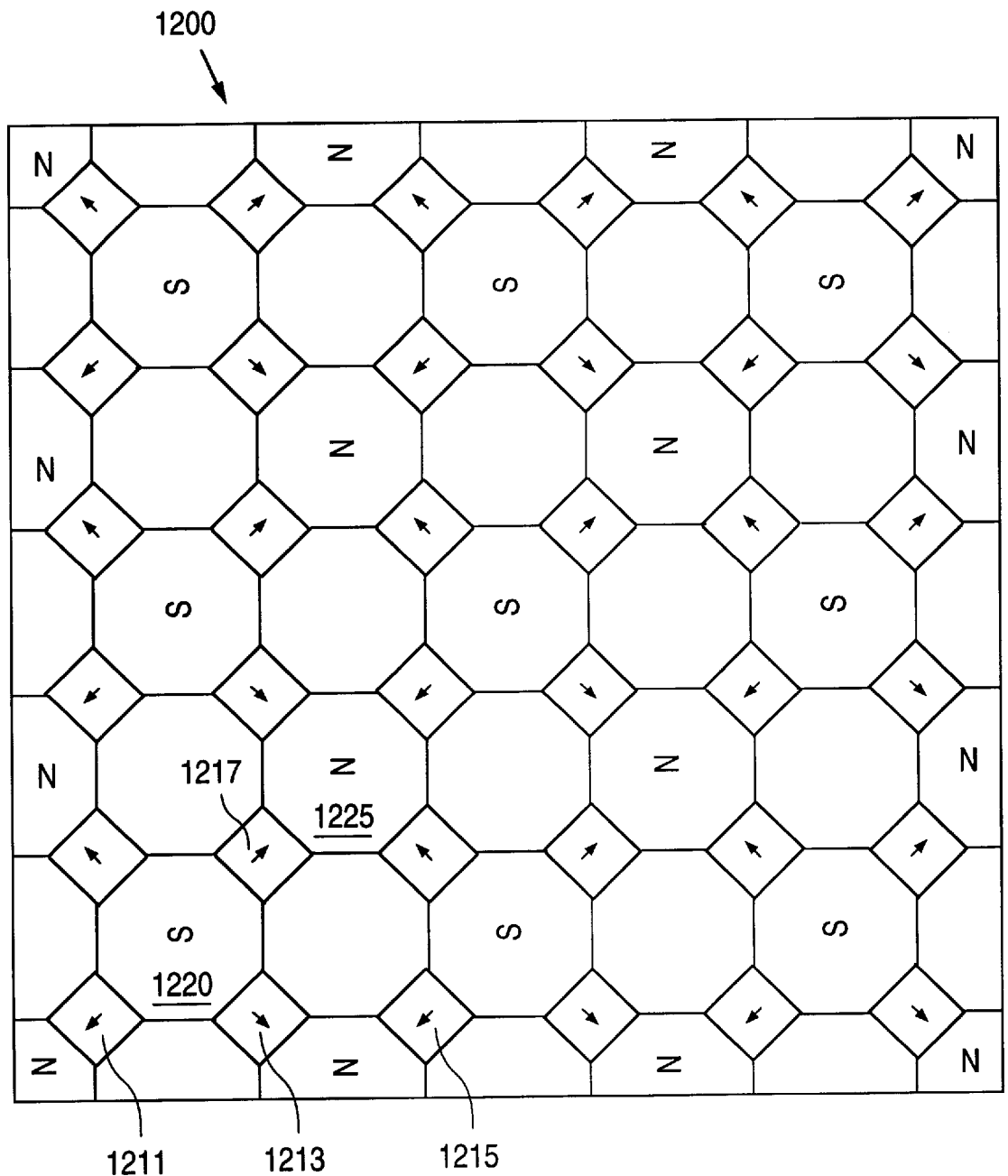
FIG. 12 is a plan view of a magnet array having transverse magnets.

FIG. 12 is a plan view of a magnet array with transverse magnets. In magnet array 1200, there are three rows and three columns of S magnets, two rows and two columns of N magnets, plus a ring of half and quarter N magnets. In magnet array 1200, there are also a plurality of transverse magnets such as magnets 1211, 1213, 1215, and 1217. Those skilled in the art will recognize that the function of these transverse magnets is to complete the magnetic circuit of a magnet array. For example, transverse magnet 1217 connects the opposite S pole of N magnet 1225 with the opposite N pole of S magnet 1220, thereby concentrating the magnetic flux from S magnet 1220 toward N magnet 1225. Because of this internal circuit completion, the external magnetic flux from N magnet 1225 toward S magnet 1220 becomes stronger. This in turn provides a stronger Lorentz force for a given electric current.

Figure 13:
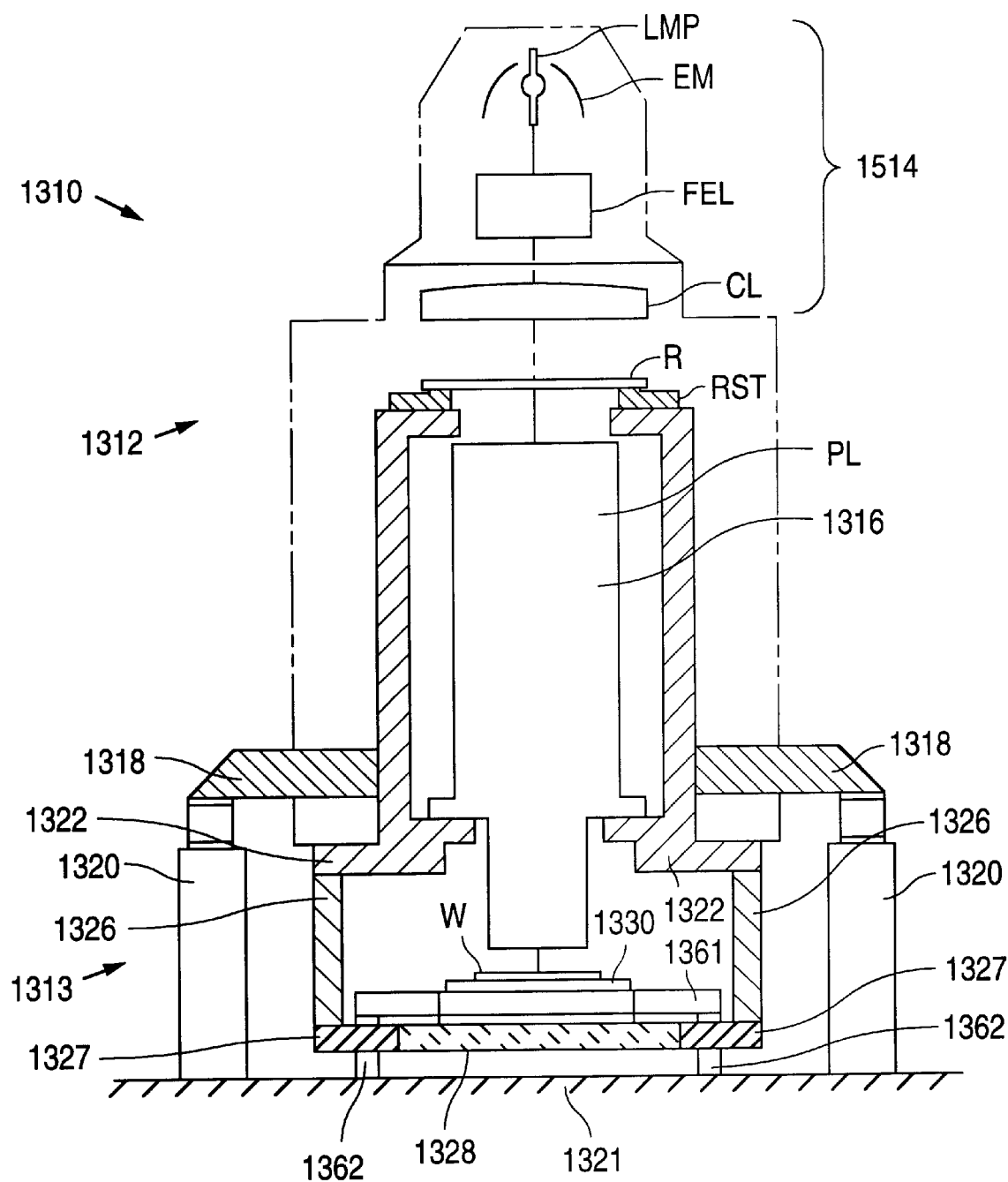
FIG. 13 is an elevational view, partially in section, showing a microlithographic apparatus incorporating a planar motor-driven positioning stage, in accordance with the present invention.

FIG. 13 is an elevational view, partially in section, showing a microlithographic apparatus 1310 incorporating a planar motor-driven positioning stage 1330 in accordance with the present invention. Microlithographic apparatus 1310, such as described in Lee, U.S. Pat. No. 5,528,118, cited above, includes an upper optical system 1312 and a lower wafer support and positioning system 1313. Optical system 1312 includes an illuminator 1314 containing a lamp LMP, such as a mercury vapor lamp, and an ellipsoidal mirror EM surrounding lamp LMP. Illuminator 1314 also comprises an optical integrator, such as a fly's eye lens FEL, producing secondary light source images, and a condenser lens CL for illuminating a reticle (mask) R with uniform light flux. A mask holder RST holding mask or reticle R is mounted above a lens barrel PL of a projection optical system 1316. A lens barrel PL is fixed on a part of a column assembly 1316 which is supported on a plurality of rigid arms 1318, each mounted on the top portion of an isolation pad or block system 1320. Microlithographic apparatus 1310 exposes a pattern of the reticle R onto a wafer W, while mask holder RST and positioning stage 1330 are moving synchronously relative to illuminator 1314.

Inertial or seismic blocks 1322 are located on the system, e.g. mounted on arms 1318. Blocks 1322 can take the form of a cast box which can be filled with sand at the operation site to reduce the shipping weight of apparatus 1310. An object or positioning stage base 1328 is supported from arms 1318 by depending blocks 1322 and depending bars 1326 and horizontal bars 1327. Positioning stage 1330 carrying wafer W is supported in a movable fashion by positioning stage base 1328. A reaction frame 1361 carries a magnet array (not shown) and drives positioning stage 1330 in cooperation with a moving coil array (not shown). Reaction frame 1361 is isolated from positioning stage base 1328 in terms of vibration relative to a foundation 1321, when a force is generated as positioning stage 1330 is driven. Positioning stage 1330 and/or mask holder RST can be driven by a planar motor such as stages 309, 409, and 603 described above in connection with FIGS. 3, 4, and 6 respectively.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. For example coil arrays may be aligned in directions non-collinear with orthogonal X and Y axes. Likewise magnets in a magnet array are not necessarily arranged in orthogonal rows and columns. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An apparatus comprising:
    a substantially planar plurality of magnetic poles which generate a magnetic field of periodic alternating polarity;
    a substantially planar coil array cooperating with said magnetic field, said coil array comprising a plurality of individual coils, each said individual coil including a coil unit;
    a commutation circuit configured to provide electric current to said coil array;
    wherein said coil array includes a first coil set including a first coil and a second coil set including a second coil, said first coil set and said second coil set respectively configured to generate a first electromagnetic force in a first principal direction and a second electromagnetic force in a second principal direction in response to said electric current in cooperation with said magnetic field; and
    wherein each said coil unit comprises an electrical conductor defining a closed band having a substantially planar geometric polygonal shape, said closed band having inner edges surrounding a void.

2. The apparatus of claim 1, wherein said commutation circuit is configured to provide selective control and independent energizing by electric current of each said individual coil of said coil array, such that all of said coil units included in said individual coil are energized by substantially equal electric current.

3. The apparatus of claim 1, wherein said polygonal shape is a diamond shape.

4. The apparatus of claim 1, wherein said polygonal shape is a hexagonal shape.

5. The apparatus of claim 1, wherein said polygonal shape is a parallelogram shape.

6. The apparatus of claim 1, wherein said first principal direction and said second principal direction respectively include direction components parallel to the plane of said coil array, said direction components being respectively substantially orthogonal to one another.

7. The apparatus of claim 1, wherein said first principal direction and said second principal direction respectively are limited to direction components which are parallel to the plane of said coil array.

8. The apparatus of claim 1, wherein said first coil set comprises a plurality of substantially identical coil units stacked such that one coil unit is overlapped partially with an adjacent coil unit to form at least one row of said coil units of substantially uniform thickness, such that all of said coil units of said row are oriented substantially identically.

9. The apparatus of claim 8, wherein said first coil set includes tow rows of said coil units, said rows being further arranged in a laterally abutting configuration, whereby said rows of coil units are oriented substantially identically.

10. The apparatus of claim 8, wherein said first coil set includes two rows of said coil units, said rows being further arranged in a laterally partially overlapping configuration, whereby said rows of coil units are oriented substantially identically.

11. The apparatus of claim 1, wherein said first coil set and said second coil set are arranged within a single substantially planar layer having substantially uniform thickness.

12. The apparatus of claim 11, wherein said first coil set and said second coil set are arranged respectively into alternating rectangular elements of a substantially planar checkerboard pattern.

13. The apparatus of claim 1, wherein said first coil set and said second coil set are stacked in separate substantially parallel layers having substantially uniform thickness.

14. The apparatus of claim 1, wherein said first principal direction and said second principal direction respectively include direction components parallel to and orthogonal to the plane of said coil array.

15. The apparatus of claim 1, further comprising a photolithographic instrument including a positioning stage, wherein said coil array is configured to move said positioning stage with a plurality of degrees of freedom in cooperation with said magnetic field.

16. An apparatus comprising:

a substantially planar plurality of magnetic poles which generate a magnetic field of periodic alternating polarity;

a substantially planar coil array cooperating with said magnetic field, said coil array comprising a plurality of individual coils, each said individual coil including a coil unit;

said coil array being electrically conected to a commutation circuit configured to provide selective control and independent energizing by electric current of each said individual coil of said coil array, such that all said coil units included in said individual coil are energized by substantially equal electric current; and wherein said coil array comprises a first coil set including a first coil and a second coil set including a second coil, said first coil set and said second coil set respectively configured to generate a first electromagnetic force in a first principal direction and a second electromagnetic force in a second principal direction in response to said electric current in cooperation with said magnetic field.

17. The apparatus of claim 16, wherein said first principal direction and said second principal direction respectively include direction components parallel to the plane of said coil array, said direction components being respectively substantially orthogonal to one another.

18. The apparatus of claim 16, wherein each said coil unit comprises an electrical conductor defining a closed band having a substantially planar geometric polygonal shape, said closed band having inner edges surrounding a void.

19. The apparatus of claim 18, wherein said first principal direction and said second principal direction respectively are limited to direction components which are parallel to the plane of said coil array.

20. The apparatus of claim 18, wherein said first principal direction and said second principal direction respectively include direction components parallel to and orthogonal to the plane of said coil array.

21. The apparatus of claim 16, further comprising a photolithographic instrument including a positioning stage, wherein said coil array is configured to move said positioning stage with a plurality of degrees of freedom in cooperation with said magnetic field.

22. An apparatus comprising:

a substantially planar magnet array, said magnet array comprising a substantially planar plurality of magnets, said plurality of magnets configured to generate a magnetic field of periodic alternating polarity, said magnets being arranged in a substantially planar checkerboard patterns having rows and columns of magnets having a first size and having alternating magnetic polarities directed perpendicular relative to the plane of said checkerboard pattern, a perimeter portion of said checkerboard pattern comprising quarter magnets and half magnets generating magnetic flux substantially one-quarter and one-half respectively of the magnetic flux of said first size magnet, one of said quarter magnets being located in each of four corners of said checkerboard pattern and said half magnets being locating abutting the four sides of said checkerboard pattern connecting said four corners;

a substantially planar coil array cooperating with said magnetic field, said coil array comprising a plurality of individual coils, each said individual coil including a coil unit; and a commutation circuit configured to provide electric current to said coil array;

wherein said coil array a configured to generate an electromagnetic force in response to said electric current in cooperation with said magnetic field.

23. An apparatus comprising:

a substantially planar magnet array, said magnet array comprising a substantially planar plurality of magnets, said plurality of magnets configured to generate a magnetic field of periodic alternating polarity, said magnets being arranged in a substantially planar checkerboard pattern having rows and columns of magnets having a first size and having alternating magnetic polarities directed perpendicular relative to the plane of said checkerboard pattern;

a substantially planar coil array cooperating with said magnetic field, said coil array comprising a plurality of individual coils, each said individual coil including a coil unit; and a commutation circuit configured to provide electirc current to said coil array;

wherein said coil array is configured to generate an electromagnetic force in response to said electric current in cooperation with said magnetic field, and wherein a cross-sectional shape of said first size magnets in the plane of said checkerboard pattern is octagonal.

24. An apparatus comprising:

a substantially planar magnet array, said magnet array comprising a substantially planar plurality of magnets, said plurality of magnets configured to generate a magnetic field of periodic alternating polarity, said magnets being arranged in a substantially planar checkerboard pattern having rows and columns of magnets having a first size and having alternating magnetic polarities directed perpendicular relative to the plane of said checkerboard pattern;

a substantially planar coil array cooperating with said magnetic field, said coil array comprising a plurality of individual coils, each said individual coil including a coil unit; and a commutation circuit configured to provide electric current to said coil array;

wherein said coil array in configured to generate an electromagnetic force in response to said electric current in cooperation with said magnetic field, and wherein said magnet array includes transverse magnets.

25. An apparatus comprising:

a substantially planar magnet array, said magnet array comprising a substantially planar plurality of magnets, said plurality of magnets configured to generate a magnetic field of periodic alternating polarity, said magnets being arranged in a substantially planar checkerboard pattern having rows and columns of magnets having a first size and having alternative magentic polarities directed perpendicular relative to the plane of said checkerboard pattern;

a substantially planar coil array cooperating with said magnetic field, said coil array comprising a plurality of individual coils, each said individual coil including a coil unit; and a commutation circuit configured to provide electric curent to said coil array;

wherein said coil array comprises a first coil set including a first coil and a second coil set including a second coil, said first coil set and said second coil set respectively configured to generate a first electromagnetic force in a first principal direction and a second electromagnetic force in a second principal direction in response to said electric current in cooperation with said magnetic field.

26. The apparatus of claim 25, wherein said first principal direction and said second principal direction respectively include direction components parallel to the plane of said coil array, said direction components being respectively substantially orthogonal to one another.

27. The apparatus of claim 25, wherein each said coil unit comprises an electrical conductor defining a closed band having a substantially planar geometric polygonal shape, said closed band having inner edges surrounding a void.

28. The apparatus of claim 25, wherein said first principal direction and said second principal direction respectively are limited to direction components which are parallel to the plane of said coil array.

29. The apparatus of claim 25, wherein each said coil unit has a length in a direction substantially parallel to a row of said checkerboard pattern, said length being substantially equal to an odd integer multiple of the spacing between adjacent columns of said checkerboard pattern.

30. The apparatus of claim 25, wherein said first principal direction and said second principal direction respectively include direction components parallel to and orthogonal to the plane of said coil array.

31. The apparatus of claim 25, further comprising a photolithographic instrument including a positioning stage, wherein said magnet array is configured to move said positioning stage with a plurality of degrees of freedom in cooperation with said coil array.

32. An apparatus comprising:
a substantially planar magnet array, said magnet array comprising a substantially planar plurality of magnets, said plurality of magnets configured to generate a magnetic field of periodic alternating polarity, said magnets being arranged in a substantially planar checkerboard pattern having rows and columns of magnets having a first size and having alternating magnetic polarities directed perpendicular relative to the plane of said checkerboard pattern; and
wherein a perimeter portion of said checkerboard pattern comprises quarter magnets and half magnets generating magnetic flux substantially one-quarter and one-half respectively of the magnetic flux of said first size magnet, one said quarter magnet being located in each of four corners of said checkerboard pattern and said half magnets being located abutting the four sides of said checkerboard pattern connecting said four corners.

33. The apparatus of claim 32, wherein a cross-sectional shape of said first size magnets in the plane of said checkerboard pattern is octagonal.

34. The apparatus of claim 32, wherein said magnet array includes transverse magnets.

35. The apparatus of claim 32, further comprising:
a substantially planar coil array cooperating with said magnetic field, said coil array comprising a plurality of individual coils, each said individual coil including a coil unit; and
a commutation circuit configured to provide electric current to said coil array;
wherein said coil array is configured to generate an electromagnetic force in response to said electric current in cooperation with said magnetic field.

36. The apparatus of claim 35, wherein said coil array comprises a first coil set including a first coil and a second coil including a second coil, said first coil set and said second coil set respectively configured to generate a first electromagnetic force in a principal direction and a second electromagnetic force in a second principal direction in response to said electric current in cooperation with said magnetic field.

37. The apparatus of claim 36, wherein said first principal direction and said second principal direction respectively include direction components parallel to the plane of said coil array, said direction components being respectively substantially orthogonal to one another.

38. The apparatus of claim 36, wherein each said coil unit comprises an electrical conductor defining a closed band having a substantially planar geometric polygonal shape, said closed band having inner edges surrounding a void.

39. The apparatus of claim 38, wherein said first principal direction and said second principal direction respectively are limited to direction components which are parallel to the plane of said coil array.

40. The apparatus of claim 38, wherein each said coil unit has a length in a direction substantially parallel to a row of said checkerboard pattern, said length being substantially equal to an odd integer multiple of the spacing between adjacent columns of said checkerboard pattern.

41. The apparatus of claim 36, wherein said first principal direction and said second principal direction respectively include direction components parallel to and orthogonal to the plane of said coil array.

42. The apparatus of claim 35, further comprising a photolithographic instrument including a positioning stage, wherein said magnet array is configured to move said positioning stage with a plurality of degrees of freedom in cooperation with said coil array.

43. A method of operating a coil array in cooperation with an associated substantially planar plurality of magnetic poles which generate a magnetic field of periodic alternating polarity, said coil array including a plurality of individual coils, each said individual coil including a coil unit, comprising:
supplying electric current to said coil array, thereby generating a resultant electromagnetic force in cooperation with said magnetic field; and
applying said resultant electromagnetic force to said coil array, wherein said coil array comprises a first set including a first coil and a second coil set including a second coil, which respectively generate a first electromagnetic force in a principal direction and a second electromagnetic force in a second principal direction;
wherein each said coil unit comprises an electrical conductor defining a closed band having a substantially planar geometric polygonal shape, said closed band having inner edges surrounding a void.

44. The method of claim 43, wherein said polygonal shape is a diamond shape.

45. The method of claim 43, wherein said polygonal shape is a hexagonal shape.

46. The method of claim 43, wherein said polygonal shape is a parallelogram shape.

47. The method of claim 43, wherein said first principal direction and said second principal direction respectively include direction components parallel to the plane of said coil array, said direction components being respectively substantially orthogonal to one another.

48. The method of claim 43, wherein said first principal direction and said second principal direction respectively are limited to direction components which are parallel to the plane of said coil array.

49. The method of claim 43, wherein said first and second electromagnetic forces are generated sequentially.

50. The method of claim 43, wherein said first and second electromagnetic forces are generated in part simultaneously.

51. The method of claim 47, wherein said resultant electromagnetic force applies a torque about an axis oriented perpendicular to the plane of said coil array.

52. The method of claim 43, wherein said resultant electromagnetic force includes a direction component directed perpendicular to the plane of said coil array.

53. The method of claim 52, wherein said resultant electromagnetic force controls the distance between said coil array and said magnet array.

54. The method of claim 53, wherein said resultant electromagnetic force controls the angle and direction of inclination between the respective planes of said coil array and said magnet array.

55. A method of operating a coil array in cooperation with an associated substantially planar plurality of magnetic poles which generate a magnetic field of periodic alternating polarity, said coil array including a plurality of individual coils, each said individual coil including a coil unit, comprising:
   selectively energizing each said individual coil independently by supplying electric current such that all of said coil units included in said individual coil are energized by substantially equal electric current, thereby generating a resultant electromagnetic force in cooperating with said magnetic field; and
   applying said resultant electromagnetic force to said coil array;
   wherein said coil array comprises a first coil set including a first coil and a second coil set including a second coil, said first coil set and said second coil set respectively configured to generate a first electromagnetic force in a first principal direction and a second electromagnetic force in a second principal direction in response to said electric current in cooperation with said magnetic field.

56. The method of claim 55, wherein said first principal direction and said second principal direction respectively include direction components parallel to the plane of said coil array, said direction components being respectively substantially orthogonal to one another.

57. The method of claim 56, wherein said resultant electromagnetic force applies a torque about an axis oriented perpendicular to the plane of said coil array.

58. The method of claim 55, wherein each said coil unit comprises an electrical conductor defining a closed band having a substantially planar geometric polygonal shape, said closed band having inner edges surrounding a void.

59. The method of claim 58, wherein said first principal direction and said second principal direction respectively are limited to direction components which are parallel to the plane of said coil array.

60. The method of claim 58, wherein said resultant electromagnetic force includes a direction component directed perpendicular to the plane of said coil array.

61. The method of claim 60, wherein said resultant electromagnetic force controls the distance between said coil array and said magnet array.

62. The method of claim 61, wherein said resultant electromagnetic force controls the angle and direction of inclination between the respective planes of said coil array and said magnet array.

63. A method of operating a coil array in cooperation with a magnet array which generates a magnetic field of periodic alternating polarity, said coil array including a plurality of individual coils, each said individual coil including a coil unit, comprising:
   supplying electric current to said coil array, thereby generating a resultant electromagnetic force in cooperation with said magnetic field; and
   applying said resultant electromagnetic force to said coil array;
   said magnet array comprising a substantially planar plurality of magnets, said magnets being arranged in a substantially planar checkerboard pattern having rows and columns of magnets of a first size and having alternating magnetic polarities directed perpendicular relative to the plane of said checkerboard pattern;
   wherein a perimeter portion of said checkerboard pattern comprises quarter magnets and half magnets generating magnetic flux substantially one-quarter and one-half respectively of the magnetic flux of said first size magnet, one of said quarter magnets being located in each of four corners of said checkerboard pattern and said half magnets being located abutting the four sides of said checkerboard pattern connecting said four corners.

64. A method of operating a coil array in cooperation with a magnet array which generates a magnetic field of periodic alternating polarity, said coil array including a plurality of individuals coils, each said individual coil including a coil unit, comprising:
   supplying electric current to said coil array, thereby generating a resultant electromagnetic force in cooperation with said magnetic field; and
   applying said resultant electromagnetic force to said coil array;
   said magnet array comprising a substantially planar plurality of magnets, said magnets being arranged in a substantially planar checkerboard pattern having rows and columns of magnets of a first size and having alternating magnetic polarities directed perpendicular relative to the plane of said checkerboard pattern;
   wherein a cross-sectional shape of said first size magnets in the plane of said checkerboard pattern is octagonal.

65. A method of operating a coil array in cooperation with a magnet array which generates a magnetic field of periodic alternating polarity, said coil array including a plurality of individual coils, each said individual coil including a coil unit, comprising:
   supplying electric current to said coil array, thereby generating a resultant electromagnetic force in cooperation with said magnetic field; and
   applying said resultant electromagnetic force to said coil array;
   said magnet array conprising a substantially planar plurality of magnets, said magnets being arranged in a substantially planar checkerboard pattern having rows and columns of magnets of a first size and having alternating magnetic polarities directed perpendicular relative to the plane of said checkerboard pattern;
   wherein said magnet array includes transverse magnets.

66. A method of operating a coil array in cooperation with a magnet array which generates a magnetic field of periodic alternating polarity, said coil array including a plurality of individual coils, each said individual coil including a coil unit, comprising:
   supplying electric current to said coil array, thereby generating a resultant electromagnetic force in cooperation with said magnetic field; and applying said resultant electromagnetic force to said coil array;

said magnet array comprising a substantially planar plurality of magnets, said magnets being arranged in a substantially planar checkerboard pattern having rows and columns of magnets of a first size and having alternating magnetic polarities directed perpendicular relative to the plane of said checkerboard pattern.

wherein said coil array comprises a first coil set including a first coil and a second set including a second coil, said first coil set and said second coil set respectively configured to generate a first electromagnetic force in a first principal direction and a second electromagnetic force in a second principal direction in response to said electric current in cooperation with said magnetic field.

67. The method of claim 66, wherein said first principal direction and said second principal direction respectively include direction components parallel to the plane of said coil array, said direction components being respectively substantially orthogonal to one another.

68. The method of claim 67, wherein said resultant electromagnetic force applies a torque about an axis oriented perpendicular to the plane of said coil array.

69. The method of claim 66, wherein said resultant electromagnetic force includes a direction component directed perpendicular to the plane of said coil array.

70. The method of claim 69, wherein said resultant electromagnetic force controls the distance between said coil array and said magnet array.

71. The method of claim 70, wherein said resultant electromagnetic force controls the angle and direction of inclination between the two respective planes of said coil array and said magnet array.

72. The method of claim 66, wherein each coil unit comprises an electrical conductor defining a closed band having a substantially planar geometric polygonal shape, said closed band having inner edges surrounding a void.

73. The method of claim 72, wherein said first principal direction and said second principal direction respectively are limited to direction components which are parallel to the plane of said coil array.

74. A method of operating a coil array in cooperation with a magnet array which generates a magnetic field of periodic alternating polarity, said coil array including a plurality of individual coils, each said individual coil including a coil unit, comprising:

supplying electric current to said coil array, thereby generating a resultant electromagnetic force in cooperation with said magnetic field; and applying said resultant electromagnetic force to said coil array;

said magnet array comprising a substantially planar plurality of magnets, said magnets being arranged in a substantially planar checkerboard pattern having rows and columns of magnets of a first size and having alternating magnetic polarities directed perpendicular relative to the plane of said checkerboard pattern;

wherein each said coil unit has a length in a direction substantially parallel to a row of said checkerboard pattern, said length being substantially equal to an odd integer multiple of the spacing between adjacent columns of said checkerboard pattern.

75. A method of controlling and moving a positioning stage of a photolithographic instrument with a plurality of degrees of freedom, comprising:

coupling said positioning stage to a coil array in cooperation with an associated substantially planar plurality of magnetic poles which generate a magnetic field of periodic alternating polarity, said coil array including a plurality of individual coils, each said individual coil including a coil unit;

supplying electric current to said coil array, thereby generating a resultant electromagnetic force in cooperation with said magnetic field; and applying said resultant electromagnetic force to said coil array, wherein said coil array comprises a first coil set including a first coil and a second coil set including a second coil, which respectively generate a first electromagnetic force in a first principal direction and a second electromagnetic force in a second principal direction;

wherein each said coil unit comprises an electrical conductor defining a closed band having a substantially planar geometric polygonal shape, said closed band having inner edges surrounding a void.

76. The method of claim 75, wherein said polygonal shape is a diamond shape.

77. The method of claim 75, wherein said polygonal shape is a hexagonal shape.

78. The method of claim 75, wherein said polygonal shape is a parallelogram shape.

79. The method of claim 75, wherein said first principal direction and said second principal direction respectively include direction components parallel to the plane of said coil array, said direction components being respectively substantially orthogonal to one another.

80. The method of claim 79, wherein said resultant electromagnetic force applies a torque about an axis oriented perpendicular to the plane of said coil array.

81. The method of claim 75, wherein said first principal direction and said second principal direction respectively are limited to direction components which are parallel to the plane of said coil array.

82. The method of claim 75, wherein said resultant electromagnetic force includes a direction component directed perpendicular to the plane of said coil array.

83. The method of claim 82, werehin said resultant electromagnetic force controls the distance between said coil array and said magnet array.

84. The method of claim 83, wherein said resultant electromagnetic force controls the angle and direction of inclination between the respective planes of said coil array and said magnet array.

85. A method of controlling and moving a position stage of a photolithographic instrument with a plurality of degrees of freedom, comprising:

coupling said positioning stage to a coil array in cooperation with an associated substantially planar plurality of magnetic poles which generate a magnetic field of periodic alternating polarity, said coil array including a plurality of individual coils, each said individual coil including a coil unit;

selectively energizing each said individual coil independently by supplying electric current such that all of said coil units included in said individual coil are energized by substantially equal electric current, thereby generating a resultant electromagnetic force in cooperation with said magnetic field; and applying said resultant electromagnetic force to said coil array;

wherein said coil array comprises a first coil set including a first coil and a second set including a second coil, said first coil set and said second coil set respectively configured to generate a first electromagnetic force in a first principal direction and a second electromagnetic force in a second principal direction in response to said electric current in cooperation with said magnetic field.

86. The method of claim 85, wherein said first principal direction and said second principal direction respectively include direction components parallel to the plane of said coil array, said direction components being respectively substantially orthogonal to one another.

87. The method of claim 86, wherein said resultant electromagnetic force applies a torque about an axis oriented perpendicular to the plane of said coil array.

88. The method of claim 85, wherein each said coil unit comprises an electrical conductor defining a closed band having a substantially planar geometric polygonal shape, said closed band having inner edges surrounding a void.

89. The method of claim 88, wherein said first principal direction and said second principal direction respectively are limited to direction components which are parallel to the plane of said coil array.

90. The method of claim 88, wherein said resultant electromagnetic force includes a direction component directed perpendicular to the plane of said coil array.

91. The method of claim 90, wherein said resultant electromagnetic force controls the distance between said coil array and said magnet array.

92. The method of claim 91, wherein said resultant electromagnetic force controls the angle and direction of inclination between the respective planes of said coil array and said magnet array.

93. A method of controlling and moving a position stage of a photolithographic instrument with a plurality of degrees of freedom, comprising:
coupling and position stage to a coil array in cooperation with a magnet array which generates a magnetic field of periodic alternating polarity, said coil array including a plurality of individual coils, each said individual coil including a coil unit;
supplying electric current to said coil array, thereby generating a resultant electromagnetic force in cooperation with said magnetic field; and
applying said resultant electromagnetic force to said coil array;
said magnet array comprising a substntially planar plurality of magnets, said magnets being arranged in a substantially planar checkerboard pattern having rows and columns of magnets of a first size and having alternating magnetic polarities directed perpendicular relative to the plane of said checkerboard pattern;
wherein a perimeter portion of said checkerboard pattern comprises quarter magnets and half magnets generating magnetic flux substantially one-quarter and one-half respectively of the magnetic flux of said first size magnet, one of said quarter magnets being located in each of four corners of said checkerboard pattern and said half magnets being located abutting the four sides of said checkerboard pattern connecting said four corners.

94. A method of controlling and moving a position stage of a photolithographic instrument with a plurality of degrees of freedom, comprising:
coupling said positioning stage to a coil array in cooperation with a magnet array which generates a magnetic field of periodic alternating polarity, said coil array including a plurality of individual coils, each said individual coil including a coil unit;
supplying electric current to said coil array, thereby generating a resultant electromagnetic force in cooperation with said magnetic field; and
applying said resultant electromagnetic force to said coil array;
said magnet array comprising a substantially planar plurality of magnets, said magnets being arranged in a substantially planar checkerboard pattern having rows and columns of magnets of a first size and having alternating magnetic polarities directed perpendicular relative to the plane of said checkerboard pattern;
wherein a cross-sectional shape of said first size magnets in the plane of said checkerboard pattern is octagonal.

95. A method of controlling and moving a position stage of a photolithographic instrument with a plurality of degrees of freedom, comprising:
coupling said positioning stage to a coil array in cooperation with a magnet array which generates a magnetic field of periodic alternating polarity, said coil array including a plurality of individul coils, each said individual coil including a coil unit;
supplying electric current to said coil array, thereby generating a resultant electromagnetic force in cooperation with said magnetic field; and
applying said resultant electromagnetic force to said coil array;
said magnet array comprising a substantially planar checkerboard pattern having rows and columns of magnets of a first size and having alternating magnetic polarities directed perpendicular relative to the plane of said checkerboard pattern;
wherein said magnet array includes transverse magnets.

96. A method of controlling and moving a position stage of a photolithographic instrument with a plurality of degrees of freedom, comprising:
coupling said positioning stage to a coil array in cooperation with a magnet array which generates a magnetic field of periodic alternating polarity, said coil array including a plurality of individual coils, each said individual coil including a coil unit;
supplying electric current to said coil array, thereby generating a resultant electromagnetic force in cooperation with said magnetic field; and
applying said resultant electromagnetic force to said coil array;
said magnet array comprising a substantially planar plurality of magnets, said magnets being arranged in a substantially planar checkerboard pattern having rows and columns of magnets of a first size and having alternating magnetic polarities directed perpendicular relative to the plane of said checkerboard pattern;
wherein said coil array comprises a first coil set including a first coil and a second coil set including a second coil, said first coil set and said second coil set respectively configured to generate a first electromagnetic force in a first principal direction and a second electromagnetic force in a second principal direction in response to said electric current in cooperation with said magnetic field.

97. The method of claim 96, wherein said first principal direction and said second principal direction respectively include direction components parallel to the plane of said coil array, said direction components being respectively substantially orthogonal to one another.

98. The method of claim 97, wherein said resultant electromagnetic force applies a torque about an axis perpendicular to the plane of said coil array.

99. The method of claim 96, wherein said resultant electromagnetic force includes a direction component directed perpendicular to the plane of said coil array.

100. The method of claim 99, wherein said resultant electromagnetic force controls the distance between said coil array and said magnet array.

101. The method of claim 100, wherein said resultant electromagnetic force controls the angle and directions of inclination between the respective planes of said coil array and said magnetic array.

102. The method of claim 96, wherein each said coil unit comprises an electrical conductor defining a closed band having a substantially planar geometric polygonal shape, said closed band having inner edges surrounding a void.

103. The method of claim 102, wherein said first principal direction and said second principal direction respectively are limited to direction components which are parallel to the plane of said coil array.

104. A method of controlling and moving a position stage of a photolithographic instrument with a plurality of degrees of freedom, comprising:

coupling said positioning stage to a coil array in cooperation with a magnet array which generates a magnetic field of periodic alternating polarity, said coil array including a plurality of individual coils, each said individual coil including a coil unit;

supplying electric current to said coil array, thereby generating a resultant electromagnetic force in cooperation with said magnetic field; and applying said resultant electromagnetic force to said coil array;

said magnet array comprising a substantially planar plurality of magnets, said magnets being arranged in a substantially planar checkerboard patterns having rows and columns of magnets of a first size and having alternating magnetic polarities directed perpendicular relative to the plane of said checkerboard pattern;

wherein each said coil unit has a length in a direction substntially parallel to a row of said checkerboard pattern, said length being substntially equal to an odd integer multiple of the spacing between adjacent columns of said checkerboard pattern.

105. An apparatus comprising:

a first member that has a substantially planar plurality of magnetic poles which generate a magnetic field;

a coil array disposed on a second member and cooperating with said magnetic field, said coil array comprising a plurality of individual coils;

a commutation circuit connected to each of said individual coils, said commutation circuit provides selective control and independent energization by electric current of each of said individual coils of said coil array, such that said coil array generates an electromagnetic force in response to said electric current in cooperation with said magnetic field; and a magnetic member that generates a magnetic force including a direction component directed perpendicular to the plane of siad coil array;

wherein said magnetic member is separated from said coil array, and said magnetic force generated by said magnetic member does not cooperate in generating said electromagnetic force.

106. The apparatus of claim 105, wherein said coil array has a first side facing said first member and a second side which differs from said first side, and said magnetic member has a first part disposed on said second side of said coil array and a second part facing said first part, such that said magnetic force is generated between said first and second parts.

* * * * *